United States Patent [19]
Ueno

[11] Patent Number: 6,117,735
[45] Date of Patent: Sep. 12, 2000

[54] SILICON CARBIDE VERTICAL FET AND METHOD FOR MANUFACTURING THE SAME

[75] Inventor: Katsunori Ueno, Kanagawa, Japan

[73] Assignee: Fuji Electric Co., Ltd., Japan

[21] Appl. No.: 09/225,171

[22] Filed: Jan. 5, 1999

[30] Foreign Application Priority Data

Jan. 6, 1998 [JP] Japan .................................. 10-000665

[51] Int. Cl.$^7$ ...................... H01L 21/336; H01L 21/3205
[52] U.S. Cl. .......................... 438/268; 438/273; 438/285; 438/589
[58] Field of Search .................................... 438/197, 268, 438/285, 138, 931, 133, 135, 139, 589, 586, 520

[56] References Cited

U.S. PATENT DOCUMENTS

| | | | |
|---|---|---|---|
| 5,399,887 | 3/1995 | Weitzel et al. | 257/194 |
| 5,459,089 | 10/1995 | Baliga | 437/40 |
| 5,539,217 | 7/1996 | Edmond et al. | 257/77 |
| 5,693,569 | 12/1997 | Ueno | 437/203 |
| 5,831,288 | 11/1998 | Singh et al. | 257/77 |
| 5,895,939 | 4/1999 | Ueno | 257/279 |
| 5,963,807 | 10/1999 | Ueno | 438/268 |
| 5,969,378 | 10/1999 | Singh | 257/77 |
| 6,054,352 | 4/2000 | Ueno | 438/268 |

OTHER PUBLICATIONS

SiC Integrated MOSFETS, by S.Onda,Kumar, and Hara, Research Laboratories, Nisshin,Aichi 470–01,Japan,pp. 369–388, Month Unknown 1997.

*Primary Examiner*—Andrew Tran
*Assistant Examiner*—Michael S. Lebentritt
*Attorney, Agent, or Firm*—Rossi & Associates

[57] ABSTRACT

In a method for forming a silicon carbide vertical FET, a first mask and a second mask that overlaps the first mask are used so that a first conductivity type impurity region is defined by one end of a certain portion of the first mask, and that portion of the first mask and the second mask are then removed so that a second conductivity type impurity region is defined by another portion of the first mask. Thus, the first conductivity type impurity region and the second conductivity type impurity region are positioned relative to each other, with respect to the first mask. If a mask including a tapered end portion is used, and ion implantation is conducted with different accelerating-field voltages, the first conductivity type region and the second conductivity type region may be formed by self-alignment, using only one mask. By controlling the impurity concentration of the channel region, the threshold voltage can be controlled, and a normally-off type FET can be provided.

21 Claims, 12 Drawing Sheets

SILICON CARBIDE VERTICAL FET AND METHOD FOR MANUFACTURING THE SAME

FIELD OF THE INVENTION

The present invention relates to a method for manufacturing vertical field-effect transistors (hereinafter referred to as FET) having a junction type or metal-oxide film-semiconductor (MOS) type gate, which use silicon carbide as a semiconductor material and serve as power semiconductor devices. The invention also relates to such vertical FET as described above.

BACKGROUND OF THE INVENTION

Silicon carbide (that will be referred to as SiC) has a wide band gap, and its maximum breakdown electric field is larger than that of silicon by one order of magnitude. Thus, SiC has been highly expected to be used as a material for power semiconductor devices in the next generation. Up to the present, various types of electron devices, in particular, those for switching large power at high temperatures, have been developed, using single-crystal wafers, such as 4H-SiC and 6H-SiC. These crystals are alpha-phase SiC in which a zinc-blend structure and a wurtzite structure are superposed on each other. Also, semiconductor devices have been fabricated using crystals of beta-phase SiC, such as 3C-SiC.

Recently, power devices, such as Shottky diodes, vertical MOSFET, and thyristors, and CMOS-IC as the most general semiconductor devices, have been fabricated using SiC as a semiconductor material, and it has been confirmed that these devices exhibit far better characteristics than conventional Si semiconductor devices, as reported by Weitzel, C. W. et al.: IEEE Trans. on Electron Devices, vol. 43, No. 10, pp. 1732–1741 (1997). Some examples of MOSFET will be now illustrated.

FIG. 13 is a cross-sectional view of a unit cell of a junction type FET (that will be abbreviated to JFET) that has been developed as a high-frequency device (Sheppard, S. T. et al: Abstract of Int. Conf. on Silicon Carbide, III-Nitrides and Related Materials, (1997)). In this device, an n drift layer 11 is laminated on a p$^+$ substrate 10, and n$^+$ source region 13, p gate region 15 and n$^+$ drain region 14 are formed in a surface layer of the n drift layer 11. Further, source electrode 17, drain electrode 18, and gate electrode 16 are formed in contact with the n$^+$ source region 13, n$^+$ drain region 14, and the p gate region 15, respectively.

With this arrangement, when a voltage is applied to the gate electrode 16, a depletion layer spreads from the p gate region 15 to an n channel region 20 defined between the p gate region 15 and the p$^+$ substrate 10. As a result, current flow between the source electrode 17 and the drain electrode 18 is restricted. By removing the voltage applied to the gate electrode 16, current flows again between the drain electrode 18 and the source electrode 17. Thus, the device is capable of switching current between the source and drain electrodes, by controlling the gate voltage. This type of JFET is called a "depletion type" since the channel region is depleted upon application of voltage to the gate electrode 16. A groove is formed which extends from the surface of the semiconductor substrate to the p$^+$ substrate 10, and is filled with an insulator film 19, so as to isolate adjacent devices.

FIG. 14 shows one type of vertical MOSFET (Shenoy, J. N., et al, Abstract of Int. Conf. on Silicon Carbide, III-Nitrides and Related Materials, (1997)). To produce the MOSFET, an n drift layer 21b is laminated on an n$^+$ substrate 21a, and a p$^+$ embedded region 22 is formed in the n drift layer 21b by implanting ions with a high accelerating-field voltage. Also, an n$^+$ source region 23 is formed in a surface layer of the n drift layer 21b located above the p$^+$ embedded region 22. A gate electrode layer 26 is formed on a gate insulating film 25 that is in turn formed on the surface of a portion of the n drift layer 21b that is interposed between two n$^+$ source regions 23. A source electrode 27 is formed on the surface of the n$^+$ source region 23, and a drain electrode 28 is formed on the rear surface of the n$^+$ substrate 21a.

In this example, the gate portion does not have a pn junction, but has a MOS structure to which a voltage is applied via the gate insulating film 25. In the MOSFET, when a positive voltage is applied to the gate electrode layer 26, an accumulation layer is induced in an n channel region 30 in a surface portion of the n drift layer 21b right below the gate electrode 26, and current flows between the drain electrode 28 and the source electrode 27. When a negative voltage is applied to the gate electrode 26, current flow between the drain electrode 28 and the source electrode 27 is interrupted or stopped. Thus, the MOSFET has a switching function. The voltage between the source and the drain is also applied to the p$^+$ embedded region 22 and the n drift layer 21b, so that the device can hold a large voltage, thus assuring a high breakdown voltage. The MOSFET is also called ACCUFET since the accumulation layer is formed upon application of a voltage to the gate electrode 26.

FIG. 15 is a cross-sectional view of a unit cell of another type of vertical high-voltage MOSFET (Onda, S. et al., Phys. Stat. Sol. (a), vol. 162, p. 369, (1997)).

In the MOSFET, a p base region 32 is formed in a surface layer of an n drift layer 31b that is laminated on an n$^+$ substrate 31a, and an n$^+$ source region 33 is formed on a surface layer of the p base region 32. Also, an n channel region 40 that connects two n$^+$ source regions 33 is formed by epitaxial growth, and a gate electrode layer 36 is formed above the surface of the n channel region 40, with a gate insulating film 35 interposed therebetween. A source electrode 37 is formed on the surface of the n$^+$ source region 33, and a drain electrode 38 is formed on the rear surface of the n$^+$ substrate 31a.

In this case, too, when a positive voltage is applied to the gate electrode layer 36, an accumulation layer is induced in a surface portion of the n channel region 40 right below the gate electrode layer 36, and current is allowed to flow from the drain electrode 38 to the source electrode 37. When a negative voltage is applied to the gate electrode layer 36, the current flow between the drain electrode 38 and the source electrode 27 is interrupted or stopped. Thus, the device performs a switching function by controlling the voltage applied to the gate electrode layer 36.

While other examples of MOSFET, such as those of planar type or trench type, may be produced using SiC substrates, it has been found from experiments that the mobility of carriers in an inversion layer of SiC is considerably small, and therefore SiC substrates are not suitable for practical use in enhancement type FET using inversion layers.

On the other hand, the devices of the above three examples are not enhancement type FET using inversion layers, but operate as FET using semiconductor layers of the original conductivity type as channels. Thus, the structures of the above examples are suitable for use with SiC.

Although semiconductor devices for power switching having the structures of FIGS. 13, 14 and 15 are expected to exhibit remarkably excellent characteristics, actual SiC devices have not realized such excellent characteristics, or such devices have not been actually manufactured.

One of the reasons is that the double-diffused MOS (D-MOS) structure that has been widely employed in Si semiconductors cannot be easily applied to SiC. In Si substrates, p-type impurities and n-type impurities are introduced into selected regions using the same mask, and then thermally diffused, so as to achieve a desired channel density with high accuracy. Namely, the dimensions of channels that greatly influence the characteristics of MOSFET can be controlled with high accuracy, thus assuring high yield in the manufacture of MOSFET.

On the other hand, impurities introduced into SiC by ion implantation are less likely to be activated, namely, the impurities thus introduced have a low activation rate. In order to improve the activation rate, the ion implantation needs to be conducted at 1000° C. or higher, and heat treatment for activation needs to be conducted at 1600° C. or higher. Also, the impurities introduced by ion implantation hardly diffuses in SiC substrates. For these reasons, p-type impurities and n-type impurities must be respectively introduced using different masks, making it difficult to control the channel density with high accuracy. The resulting MOSFET has large channel resistance with considerably large variations, and the resistance of the device as a whole is mostly determined by the channel resistance. This makes it difficult for SiC to exhibit its inherent characteristics.

SUMMARY OF THE INVENTION

In view of the above problems, it is an object of the present invention to provide a method for manufacturing a silicon carbide vertical FET whose channel is controlled with high accuracy, and which can easily provide a high breakdown voltage. It is another object of the invention to provide such a silicon carbide vertical FET.

To accomplish the above object, the present invention provides a method for manufacturing a silicon carbide vertical FET, comprising the steps of: laminating a first conductivity type drift layer comprising silicon carbide, on a first conductivity type silicon carbide substrate; forming a second conductivity type gate region and a first conductivity type source region in mutually spaced, selected portions of a surface layer of the first conductivity type drift layer; forming a second conductivity type embedded region in a selected portion below the second conductivity type gate region and the first conductivity type source region; forming a gate electrode layer in contact with a surface of the second conductivity type gate region; forming a source electrode in contact with surfaces of both of the first conductivity type source region and the second conductivity type embedded region; and forming a drain electrode on a rear surface of the silicon carbide substrate, wherein the first conductivity type source region, the second conductivity type gate region and the second conductivity type embedded region are respectively formed using a first mask including a first portion and a second portion, such that one end of the first conductivity type source region is defined by one of opposite ends of the first portion of the first mask, and the second conductivity type gate region is defined by the other end of the first portion of the first mask, and the second portion of the first mask, while an end of the second conductivity type embedded portion is defined by the second portion of the first mask.

One example of specific process of manufacturing a silicon carbide vertical FET includes the steps of: preparing a silicon carbide substrate by epitaxially growing a first conductivity type drift layer comprising silicon carbide, on a first conductivity type silicon carbide substrate; forming a first mask on a surface of the first conductivity type drift layer; forming a second mask made of a different material from that of the first mask, such that the second mask overlaps the first mask; introducing impurities so as to form a first conductivity type source region in a selected portion of a surface layer of the first conductivity type drift layer, using the first mask and the second mask; removing the second mask; forming a third mask made of a different material from that of the first mask, such that the third mask overlaps the first mask; introducing impurities so as to form a second conductivity type gate region in a selected portion of a surface layer of the first conductivity type drift layer, using the first mask and the third mask; removing a first portion of the first mask and the third mask while leaving a second portion of the first mask; introducing impurities so as to form a second conductivity type embedded region in a selected portion of the surface layer of the first conductivity type drift layer, using the second portion of the first mask; conducting heat treatment for activating the introduced impurities; forming a fourth mask on a surface of the silicon carbide substrate; forming a recessed portion that extends from a surface of the first conductivity type source region to the second conductivity type embedded region, using the fourth mask; forming a fifth mask comprising an insulating material; and vapor-depositing a metallic film so as to form a gate electrode, a source electrode and a drain electrode.

In the method as described above, the substantial dimensions of the channel region are determined by the first mask, and therefore the channel length can be controlled with high accuracy, without suffering from non-uniformity due to misalignment of masks. It is thus possible to produce a FET having small ON-state resistance.

Instead of forming the recessed portion that extends from the surface of the first conductivity type source region to the second conductivity type embedded region, a second conductivity type contact region that reaches the second conductivity type embedded region can be formed. In this case, the source electrode may be provided on the surface of the SiC substrate.

In particular, the impurities may be introduced so as to form the first conductivity type source region, second conductivity type gate region, and the second conductivity type embedded region, by implanting ions into the selected portions of the surface layer of the first conductivity type drift layer. In this manner, the impurity regions can be surely formed even in the SiC substrate.

An electrode may be provided which cooperates with the surface of the first conductivity type drift layer to form a Shottky junction. In this case, the length of the channel region can be reduced as compared with the dimensions of the second conductivity type gate region required for reducing contact resistance.

According to another aspect of the invention, a method for manufacturing a silicon carbide vertical FET is provided which includes the steps of: laminating a first conductivity type drift layer comprising silicon carbide, on a first conductivity type silicon carbide substrate; forming a first conductivity type source region in a selected portion of a surface layer of the first conductivity type drift layer; forming a second conductivity type embedded region in a selected portion below the first conductivity type source region; forming a gate electrode layer on a gate insulating film that is formed on a surface of the first conductivity type drift layer; forming a source electrode in contact with surfaces of both of the first conductivity type source region and the second conductivity type embedded region; and forming a drain electrode on a rear surface of the silicon carbide substrate, wherein the first conductivity type source region and the second conductivity type embedded region are respectively formed using a first mask including a first portion and a second portion, such that one end of the first conductivity type source region is defined by the first portion of the first mask, and the second conductivity type embedded region is defined by the second portion of the first mask.

One example of specific process of manufacturing a silicon carbide vertical FET includes the steps of: preparing a silicon carbide substrate by epitaxially growing a first conductivity type drift layer comprising silicon carbide, on a first conductivity type silicon carbide substrate; forming a first mask on a surface of the first conductivity type drift layer; forming a second mask made of a different material from that of the first mask, such that the second mask overlaps the first mask; introducing impurities so as to form a first conductivity type source region in a selected portion of a surface layer of the first conductivity type drift layer, using the first mask and the second mask; removing a first portion of the first mask and the second mask, while leaving a second portion of the first mask; introducing impurities so as to form a second conductivity type embedded region in a selected portion of the surface layer of the first conductivity type drift layer; removing the second portion of the first mask; conducting heat treatment for activating the introduced impurities; forming a gate oxide film on a surface of the silicon carbide substrate by thermal oxidation; depositing a polysilicon layer on the gate oxide film, and patterning the polysilicon layer; forming a third mask after covering the polysilicon layer and the gate oxide film with an insulating film; forming a recessed portion that extends from a surface of the first conductivity type source region to the second conductivity type embedded region, using the third mask; and forming contact holes through the insulating film, and vapor-depositing metallic films so as to form a gate electrode that contacts with the polysilicon layer, a source electrode that contacts with the first conductivity type source region and the second conductivity type embedded region, and a drain electrode that contacts with the silicon carbide substrate.

In this case, too, the dimensions of the channel region are determined by the first mask, and therefore the channel length can be controlled with high accuracy, without suffering from non-uniformity due to misalignment of masks.

Instead of forming the recessed portion that extends from the surface of the first conductivity type source region to the second conductivity type embedded region, a second conductivity type contact region that reaches the second conductivity type embedded region can be formed. In this case, the source electrode may be provided on the surface of the SiC substrate.

In another method for manufacturing a silicon carbide vertical FET, the first conductivity type source region and the second conductivity type base region are respectively formed using a first mask including a tapered end portion that has a small-thickness end having a first thickness, and a large-thickness end having a second thickness that is larger than the first thickness, such that one end of the first conductivity type source region is defined by the small-thickness end of the tapered end portion of the first mask, and an end of the second conductivity type base region is defined by the large-thickness end of the tapered end portion of the first mask.

One example of specific process of manufacturing a silicon carbide vertical FET includes the steps of: preparing a silicon carbide substrate by epitaxially growing a first conductivity type drift layer comprising silicon carbide, on a first conductivity type silicon carbide substrate; forming a first mask on a surface of the first conductivity type drift layer, the first mask including a tapered end portion that has a small-thickness end having a first thickness, and a large-thickness end having a second thickness that is larger than the first thickness; introducing impurities so as to form a first conductivity type source region in a selected portion of a surface layer of the first conductivity type drift layer, using the first mask, such that the first conductivity type source region is defined by the small-thickness end of the tapered end portion of the first mask; introducing impurities so as to form a second conductivity type base region in a selected portion of the surface layer of the first conductivity type drift layer, using the first mask, such that the second conductivity type base region is defined by the large-thickness end of the tapered end portion of the first mask; forming a third mask on a surface of the silicon carbide substrate; introducing impurities so as to form a second conductivity type contact region that reaches the second conductivity type base region, using the third mask; removing the first mask; conducting heat treatment for activating the introduced impurities; forming a gate oxide film on a surface of the silicon carbide substrate by thermal oxidation; depositing a polysilicon layer on the gate oxide film, and patterning the polysilicon layer; forming a fourth mask after covering the polysilicon layer and the oxide film with an insulating film; forming a recessed portion that extends from a surface of the first conductivity type source region to the second conductivity type contact region, using the fourth mask; forming contact holes through the insulating film, and vapor-depositing metallic films so as to form a gate electrode that contacts with the polysilicon layer, a source electrode that contacts with the first conductivity type source region and the second conductivity type contact region, and a drain electrode that contacts with the silicon carbide substrate.

In this case, too, the dimensions of the channel region are determined by the first mask, and therefore the channel length can be controlled with high accuracy, without suffering from non-uniformity due to misalignment of masks. Furthermore, there is no need to prepare another mask for forming the impurity regions.

In the method as described above, a recessed portion may be formed which extends from the surface of the first conductivity type source region to the second conductivity type base region, and the source electrode that contacts with the first conductivity type source region and the second conductivity type contact region may be provided.

In particular, a side wall may be formed on the side faces of the first mask, and impurities may be introduced so as to form the second conductivity type contact region, using the first mask and the side wall as a mask. In this manner, the second conductivity type contact region that is shifted from the second conductivity type base region may be formed without aligning or positioning different masks.

After forming a relatively thick third mask for forming the second conductivity type contact region, and introducing impurities using this mask, the third mask may be etched back, to provide a first mask having a gently or moderately tapered end portion. In this case, the first mask and the third mask originate from the same mask, and another mask material need not be provided.

The introduction of the impurities for forming the first conductivity type source region, the second conductivity type embedded region, and the second conductivity type base region may be achieved by implanting ions into the first conductivity type drift layer. In this manner, the impurity regions can be surely formed even in the SiC substrate.

The manufacturing methods as described above may further include a step of introducing first conductivity type impurities over the entire area of the surface layer of the first conductivity type drift layer, so as to control an impurity concentration of a channel region. The threshold voltage can be controlled by controlling the impurity concentration of the channel region and a normally-off type FET can be provided.

According to a further aspect of the present invention, there is provided a silicon carbide vertical FET, which comprises: a first conductivity type silicon carbide substrate; a first conductivity type drift layer comprising silicon carbide, which is laminated on the first conductivity type silicon carbide substrate; a second conductivity type base region formed in a selected portion of a surface layer of the first conductivity type drift layer, such that at least a part of the second conductivity type base region is embedded within the first conductivity type drift layer; a first conductivity type source region formed on in contact with a part of an upper surface of the second conductivity type base region; a gate electrode layer formed on a gate insulating layer that is formed on a channel region that is provided by a portion of the first conductivity type drift layer that remains on the second conductivity type base region; a source electrode formed in contact with surfaces of both of the first conductivity type source region and the second conductivity type base region; and a drain electrode formed on a rear surface of the silicon carbide substrate, wherein the second conductivity type base region includes an end portion whose junction depth is reduced almost linearly as a distance from the first conductivity type source region increases. If the manufacturing method as described above is employed, the length of the channel region can be easily controlled, and a vertical FET having a uniform channel region can be easily produced.

In the silicon carbide vertical FET as described above, a second conductivity type contact region having a higher impurity concentration and a larger junction depth than the second conductivity type base region may be formed such that the second conductivity type contact region overlaps the second conductivity type base region, and the source electrode contacts with the second conductivity type contact region. Alternatively, a recessed portion that extends from a surface of the first conductivity type source region to the second conductivity type contact region may be formed, so that the source electrode contacts with an exposed surface of the second conductivity type contact region.

If the source electrode is in contact with the surface of the second conductivity type contact region that is flush with the surface of the first conductivity type source region, there is no need to provide a recessed portion. If the recessed portion is formed to extend from the surface of the first conductivity type source region to the second conductivity type contact region, for contact with the source electrode, the thickness of the second conductivity type region need not be increased.

If the impurity concentration of the channel region is higher than that of the first conductivity type drift layer, the threshold voltage can be controlled by controlling the impurity concentration, and a normally-off type FET can be provided.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Figure 14:
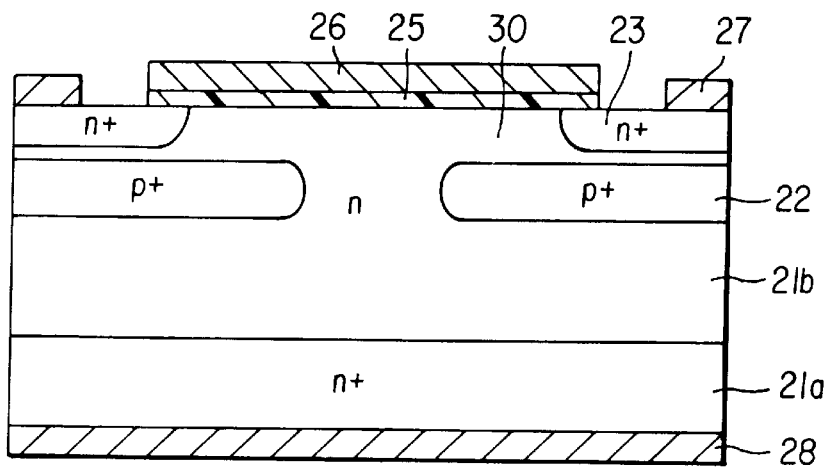
FIG. 14 is a cross-sectional view showing a known example of MOSFET.
Figure 15:
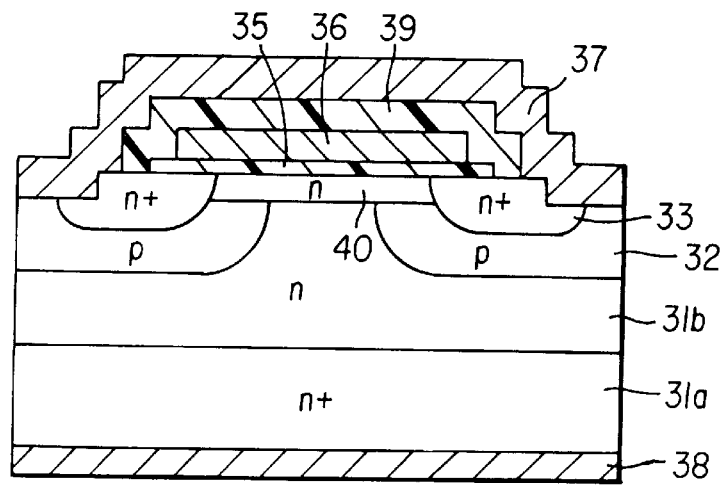
FIG. 15 is a cross-sectional view showing another known example of MOSFET.

Some embodiments of the present invention will be described in detail, though no description will be provided with respect to such portions that are identical with those of the known examples of FIGS. 13–15, or not related to the present invention. While n channel MOSFET will be illustrated as important applications of the present invention, it is to be understood that this invention is equally applicable to p channel MOSFET having the opposite conductivity types. While numerous polytypes of silicon carbide are available, 6H-SiC or 4H-SiC is mainly employed in the following embodiments.

First Embodiment

Figure 1:
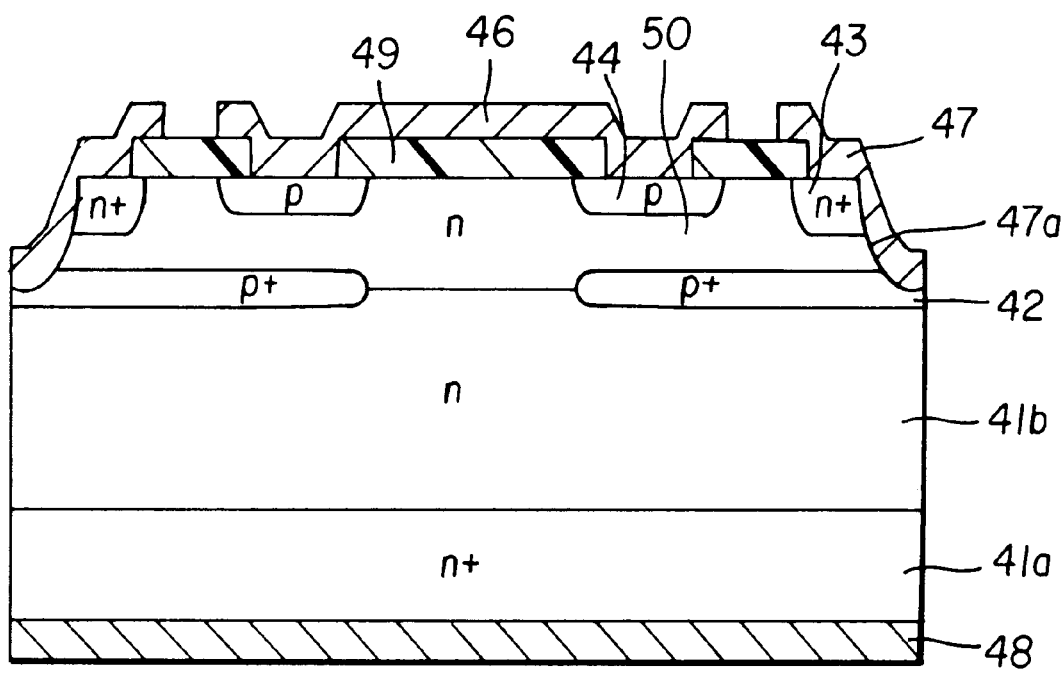
FIG. 1 is a cross-sectional view showing a JFET according to the first embodiment of the present invention.

FIG. 1 is a cross-sectional view of a unit cell of SiC JFET according to the first embodiment of the present invention. This embodiment corresponds to the known device of FIG. 13, but has a higher breakdown voltage than the known device.

In the SiC JFET of FIG. 1, an n drift layer 41$b$ is epitaxially grown on an n$^+$ substrate 41$a$, to provide a wafer in which a p$^+$ embedded region 42 is formed at a location that is spaced a small distance from the surface of the n drift layer 41$b$, and p gate region 44 and n$^+$ source region 43 are formed in a surface layer of the n drift layer 41$b$ above the p$^+$ embedded region 42. A gate electrode 46 is formed on the surface of the p gate region 44. A source electrode 47 is formed along the surface of a recessed portion 47*a* that extends downwards from the surface of the n⁺ source region 43, such that the source electrode 47 is in contact with surfaces of both of the n⁺ source region 43 and the p⁺ embedded region 42. A drain electrode 48 is formed in contact with the rear surface of the n⁺ substrate 41*a*.

The dimensions of the respective layers or regions of the device may be determined as follows. The n⁺ substrate 41*a* has an impurity concentration of $1\times10^{18}$ cm$^{-3}$ and a thickness of 350 $\mu$m, and the n drift layer 41*b* has an impurity concentration of $1\times10^{16}$ cm$^{-3}$ and a thickness of 10 $\mu$m. The p⁺ embedded region 42 has the maximum impurity concentration of $5\times10^{18}$ cm$^{-3}$ and a thickness of 0.5 $\mu$m, and the portion of the n drift layer 41*b* located above the p⁺ embedded region 42 has a thickness of 0.5 $\mu$m. Two opposite p⁺ embedded regions 42 are spaced about 5 $\mu$m from each other. The n⁺ source region 43 has an impurity concentration of $1\times10^{19}$ cm$^{-3}$, a junction depth of 0.2 $\mu$m, and a width of about 3 $\mu$m. The p gate region 44 has an impurity concentration of $5\times10^{18}$ cm$^{-3}$, a junction depth of 0.2 $\mu$m, and a width of about 2 $\mu$m. The spacing between the n⁺ source region 43 and the p gate region 44 is about 1 $\mu$m, and the n drift layer 41*b* reaches the surfaces of these regions 43, 44. The recessed portion 47*a* has a depth of 0.7 $\mu$m as measured from the surface of the n drift layer 41*b*, and a width of about 3 $\mu$m. The pitch of unit cells as shown in FIG. 1 is about 25 $\mu$m.

Figure 13:
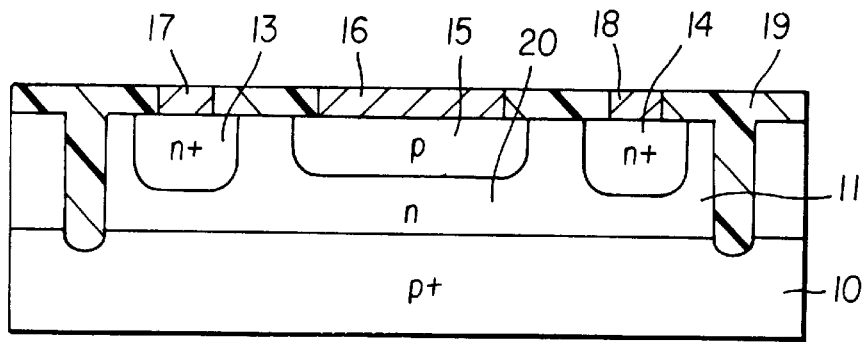
FIG. 13 is a cross-sectional view showing a known example of JFET.

In comparison with the lateral JFET of FIG. 13, the JFET of the present embodiment is of vertical type in which the source electrode 47 and the drain electrode 48 are provided on the opposite main surfaces of the semiconductor substrate. Its operation, however, is basically the same as that of the known example of FIG. 13. More specifically, when a voltage is applied to the gate electrode 46, a depletion layer spreads from the p gate region 44 to the channel region 50 located below, so that the n⁺ source region 43 and the n drift layer 41*b* are electrically insulated from each other. As a result, current flow from the drain electrode 48 to the source electrode 47 is restricted. Thus, the JFET is of the same depletion type as the known example of FIG. 13.

FIG. 2(*a*) through FIG. 2(*f*) and FIG. 3(*a*) through FIG. 3(*d*) are cross-sectional views showing the vicinity of the surface of the semiconductor substrate in the order of manufacturing steps, which views are useful in explaining a method for manufacturing the SiC JFET of the first embodiment of FIG. 1.

Initially, the n drift layer 41*b* doped with phosphorous is epitaxially grown on the n⁺ substrate 41*b*, to provide a 4H-SiC substrate. For example, the n drift layer 41*b* has an impurity concentration of $1\times10^{16}$ cm$^{-3}$ and a thickness of 10 $\mu$m. A polycrystalline silicon or polysilicon film is deposited on the surface of the n drift layer 41*b* by reduced-pressure CVD, and formed into a certain pattern by photolithography, to provide the first mask M1, as shown in FIG. 2(*a*). The first mask M1 consists of an inner portion M1*a* and an outer portion M1*b*. The thickness of the polysilicon film is 1 $\mu$m.

The first mask M1 is not necessarily formed from the polysilicon film, but may consist of a silicon dioxide film (that will be called SiO$_2$ film) often used in silicon process, or silicon nitride film, or photoresist, provided the mask permits selective etching. Where ion implantation is conducted at a high temperature, the mask needs to be formed of a material, such as polysilicon, that is able to withstand the high temperature.

Subsequently, a SiO$_2$ film is deposited on the first mask M1 of the polysilicon film by thermal CVD, and patterned by photolithography, to provide a second mask M2, and ions, such as nitrogen (N) ions 4*a*, that provide n-type impurities are implanted into a region that is defined by the first and second masks M1, M2, as shown in FIG. 2(*b*), in which 4*b* denotes nitrogen (N) atoms thus implanted. Thus, the n⁺ source region 43 is formed by implanting the nitrogen ions with an accelerating-field voltage of 100 keV and a dose amount of about $5\times10^{15}$ cm$^{-2}$. The temperature is controlled to about 800° C. during ion implantation. By implanting the ions at such a high temperature, the ion activation rate can be improved. The second mask M2 is not necessarily formed from a SiO$_2$ film, but must be formed from a material that is different from the first mask M1 and permits selective etching, since the second mask M2 will be removed while leaving the first mask M1 in a later step. Where the first mask M1 is formed from a polysilicon film, for example, the second mask M2 may be formed from a SiO$_2$ film as in this embodiment, so that only the second mask M2 can be removed by hydrofluoric acid. To the contrary, if the first mask M1 is formed from a SiO$_2$ film and the second mask M2 is formed from a polysilicon film, only the polysilicon film may be etched by reactive ion etching (that will be referred to as RIE) using mixed gases of carbon tetrachloride and oxygen, while controlling the etching rates of the SiO$_2$ film and polysilicon film. Thus, the material of the second mask M2 is selected so that only the second mask M2 is selectively removed while leaving the first mask M1. The second mask M2 can be easily positioned since its edge is only required to be located on the first mask M1. The n-type impurities may be selected from phosphorous (P) and other elements, in addition to nitrogen (N).

After removing the second mask M2 in the form of SiO$_2$ film, an SiO$_2$ film is deposited again by thermal CVD, and patterned by photolithography, to provide a third mask M3, and ions that provide p-type impurities, such as boron (B) ions 5*a*, are implanted into a region that is defined by the first and third masks M1, M3, as shown in FIG. 2(*c*), in which 5*b* denote boron atoms. The boron ions 5*a* are implanted with an accelerating-field voltage of 100 keV and a dose amount of about $5\times15$ cm$^{-2}$, so as to form the p gate region 44. In this case, too, the third mask M3 does not necessarily formed from a SiO$_2$ film, but may be formed of any material provided that only the third mask M3 can be selectively removed while leaving the first mask M1 in a later step. The third mask M3 can be easily positioned relative to the semiconductor substrate since its edge is only required to be located on the first mask M1. The p-type impurities may be selected from aluminum (Al) and other elements, other than boron (B).

Subsequently, the third mask M3 in the form of a SiO$_2$ film and the outer portion M1*b* of the first mask are removed, while leaving only the inner portion M1*a* of the first mask on the substrate, as shown in FIG. 2(*d*). Using the remaining portion of the first mask M1*a* as a mask, boron ions 5*a* are implanted again with an accelerating-field voltage of 400 keV and a dose amount of about $1\times10^{15}$ cm$^{-2}$, as shown in FIG. 2(*e*), so as to form the p⁺ embedded region 42. An increased accelerating-field voltage is employed so as to form a deep impurity region. The p-type impurities may be selected from aluminum (Al) and other elements, in addition to boron (B).

The remaining portion M1*a* of the first mask is removed, and nitrogen (N) ions 4*a* are implanted over the entire surface of the semiconductor substrate, as shown in FIG. 2(*f*), in which 4*b* denote nitrogen (N) atoms. The nitrogen ions 4*a* are implanted with an accelerating-field voltage of 200 keV and a dose amount of about $1\times10^{12}$ cm$^{-2}$, so as to control the concentration of the n channel region 50. Since the boron ions were implanted to a large depth so as to form the p+ embedded region 42 in the previous step, the boron atoms are present in the surface layer of the n drift layer 41b located above the p+ embedded region 42. By implanting the nitrogen (N) ions as described above, the resistance of the surface layer can be stabilized. The impurity concentration of the surface layer after heat treatment is about $5 \times 10^{15}$ cm$^{-3}$.

Figure 3A:
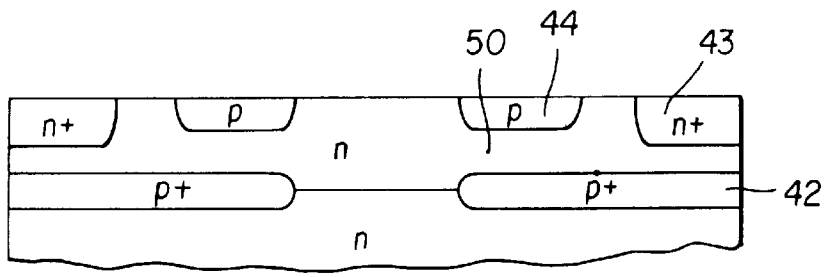
FIG. 3(a) through FIG. 3(d) are cross-sectional views showing process steps following the step of FIG. 2(f) in the manufacture of the JFET of the first embodiment.

By conducting heat treatment at 1600° C. for two hours so as to activate the implanted impurities, the n+ source region 43, p gate region 44 and p+ embedded region 42 are respectively formed as shown in FIG. 3(a). Although diffusion of the impurities is unlikely occur in the SiC substrate, as described before, the depth of the impurity regions can be controlled by suitably adjusting the accelerating-field voltage. To produce the p+ embedded region 42, for example, the accelerating-field voltage is increased to 400 keV, so that a 0.5 μm-thickness layer is formed at around a depth of 0.8 μm, and an about 0.5 μ-thickness n drift region 41b remains on the p+ embedded region 42. The depth of the p gate region 44 and the n+ source region 43 is about 0.2 μm.

Figure 3B:
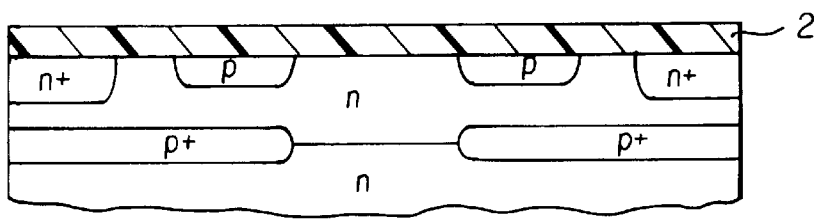
Figure 3C:
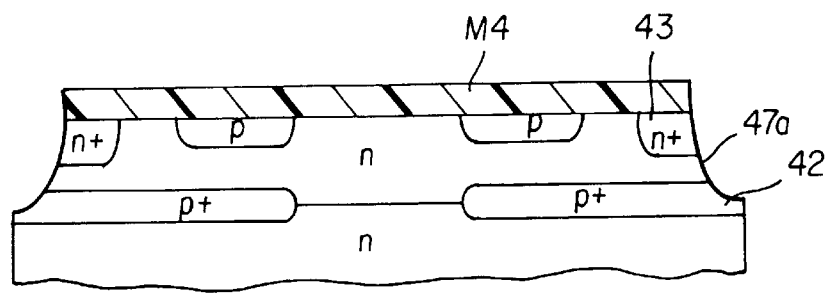

Subsequently, a SiO$_2$ film 2 is deposited by CVD on the surface of the SiC substrate, as shown in FIG. 3(b). The SiO$_2$ film 2 is then patterned by photolithography, to provide a fourth mask M4, and the recessed portion 47a that extends from the surface of the n+ source region 43 to the p+ embedded region 42 is formed by reactive ion etching using mixed gases of carbon tetrafluoride (CF$_4$) and oxygen (O$_2$), as shown in FIG. 3(c).

Figure 3D:
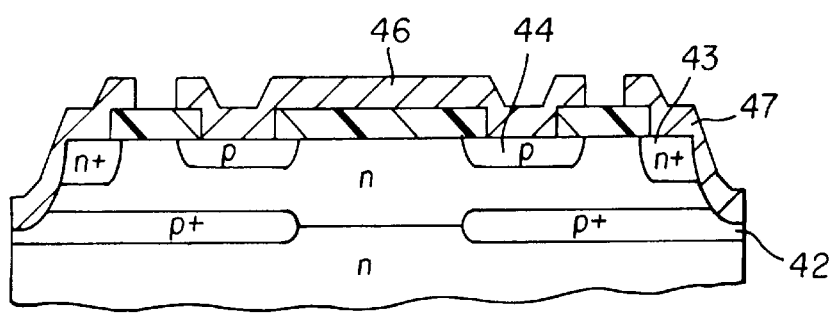

After forming openings or contact holes through the SiO$_2$ film 2 by photolithography, aluminum alloy films are formed by vapor deposition, and patterned, so as to provide source electrode 47 and gate electrode 46, as shown in FIG. 3(d). A drain electrode is also provided on the rear surface of the n+ substrate, and the manufacturing process is completed.

By employing the manufacturing method as described above, the high-voltage SiC vertical JFET as shown in FIG. 1 can be produced.

In the SiC JFET of the first embodiment, the n+ source region 43 is defined by an edge of the outer portion M1b of the first mask, and the p gate region 44 is defined by another edge of the outer portion M1b of the first mask, and the inner portion M1a of the first mask. Further, the inner periphery of the p+ embedded region 42 is defined by the edge of the inner portion M1a of the first mask. Thus, the impurity regions are defined only by means of the first mask M1, and suitably positioned relative to each other, causing no problem of non-uniformity due to variations in position that would occur if the regions were defined by a plurality of masks. Another advantage is that the dimensions of the respective impurity regions can be confirmed after the pattern of the first mask M1 is formed.

The length of the channel region is a main parameter based on which the characteristics of the JFET are determined, and therefore it is extremely important in terms of its application to control the channel length with sufficiently high accuracy. In the SiC JFET of the first embodiment, the length of the n channel region 50 located under the p gate region 44, which is substantially equal to the channel length, can be made uniform and sufficiently small, thus assuring stable characteristics of the JFET and high yield in the manufacture thereof. For example, the ON resistance of a 1500V-class JFET fabricated according to the present embodiment was as low as 15 m Ω·cm$^{-2}$.

Furthermore, since the p+ embedded region 42 is formed by ion implantation with a high accelerating-field voltage, to provide a large junction depth, the resulting JFET easily achieves a breakdown voltage of 1500V or higher.

By adding the step of implanting nitrogen (N) ions into the surface layer of the n drift layer 41b so as to control the impurity concentration, the threshold voltage of the JFET can be controlled as desired, to thus provide a normally-off type FET.

The above manufacturing method may be modified in several ways. For example, the order of ion implantation for forming the n+ source region 43 and the p gate region 44 may be reversed. Also, the ion implantation for controlling the impurity concentration of the n channel region 50 may be initially conducted. If the ion implantation is conducted at a temperature lower than 1000° C., the masks may be selected from a wider range of materials.

Second Embodiment

Figure 4:
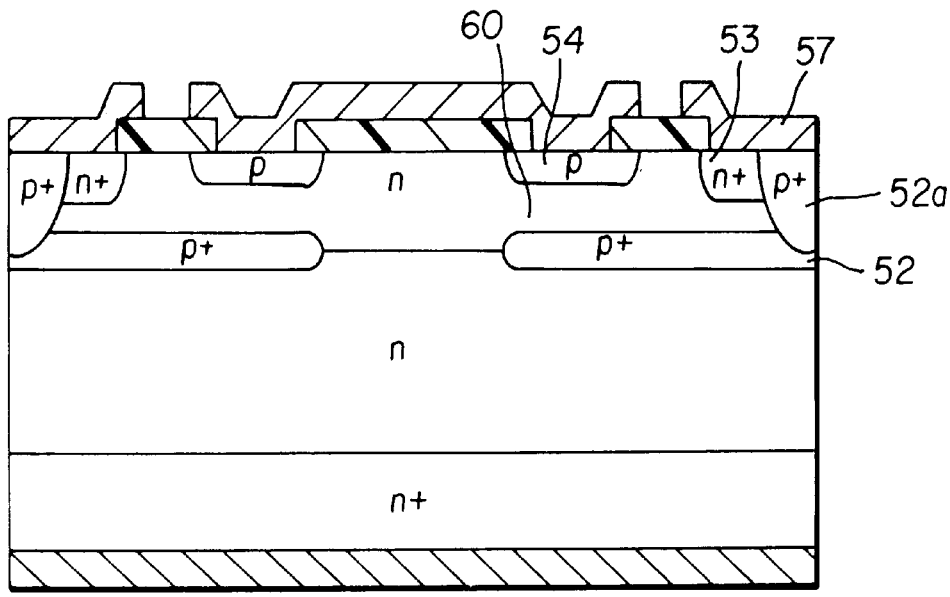
FIG. 4 is a cross-sectional view showing a JFET according to the second embodiment of the present invention.

FIG. 4 is a cross sectional view of a SiC JFET according to the second embodiment of the present invention, which is a modified example of the first embodiment of FIG. 1.

In the present embodiment, the recessed portion as described above is not formed in the surface of the SiC substrate, but a p+ contact region 52a that reaches the p+ embedded region 52 is formed in the surface layer of the n drift layer 51b. The source electrode 57 is formed on the p+ contact region 52a in contact with both the p+ contact region 52a and the n+ source region 53.

Figure 2A:
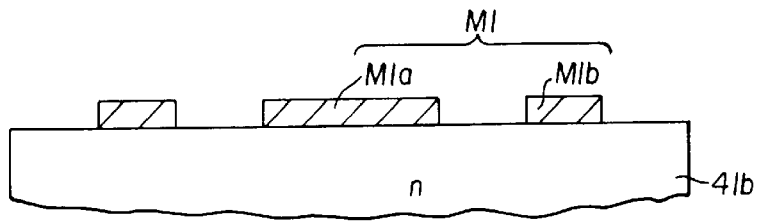
FIG. 2(a) through FIG. 2(f) are cross-sectional views showing process steps for manufacturing the JFET of the first embodiment of FIG. 1.
Figure 2B:
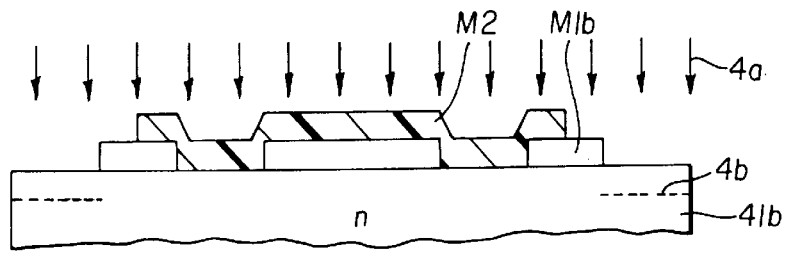
Figure 2C:
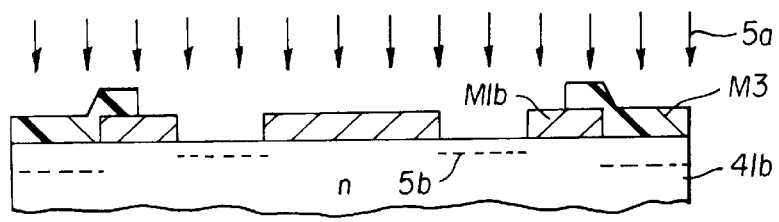
Figure 2D:
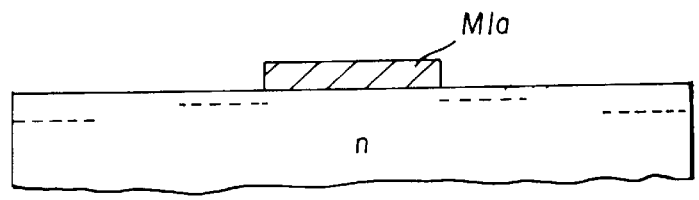
Figure 2E:
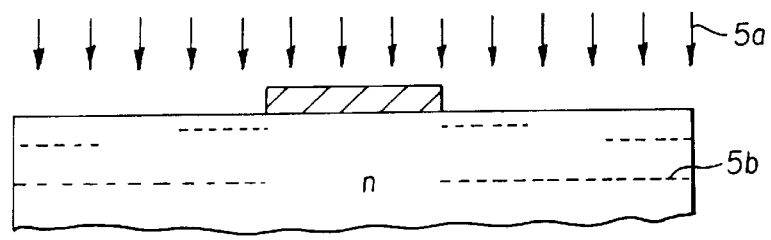
Figure 2F:
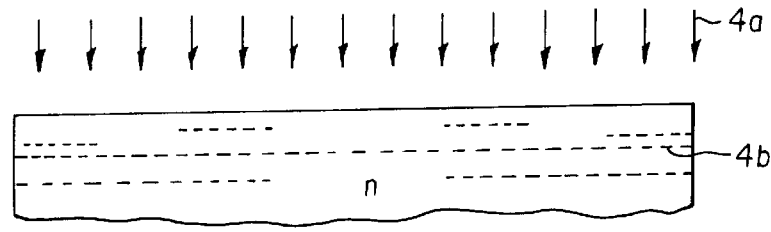

In the manufacture of the JFET of the present embodiment, a mask (corresponding to the mask M2 in FIG. 2(b)) used when implanting nitrogen (N) ions so as to from the n+ source region 53 is designed to also define the outer edge of the n+ source region, and another mask is used when implanting boron (B) ions so as to form the p+ contact region 52a. In the present embodiment, therefore, the recessed portion need not be formed, and the source electrode can be formed on the surface of the substrate.

As in the first embodiment, the inner edge of the n+ source region is defined by a portion (corresponding to M1b in FIG. 2(b)) of the first mask, and the length of the channel region is determined in the same manner as in the first embodiment. Thus, the n channel region 60 located under the p gate region 54 is formed with a small, uniform channel length that is controlled with high accuracy, thus assuring stable characteristics of the JFET and high yield.

Third Embodiment

Figure 5:
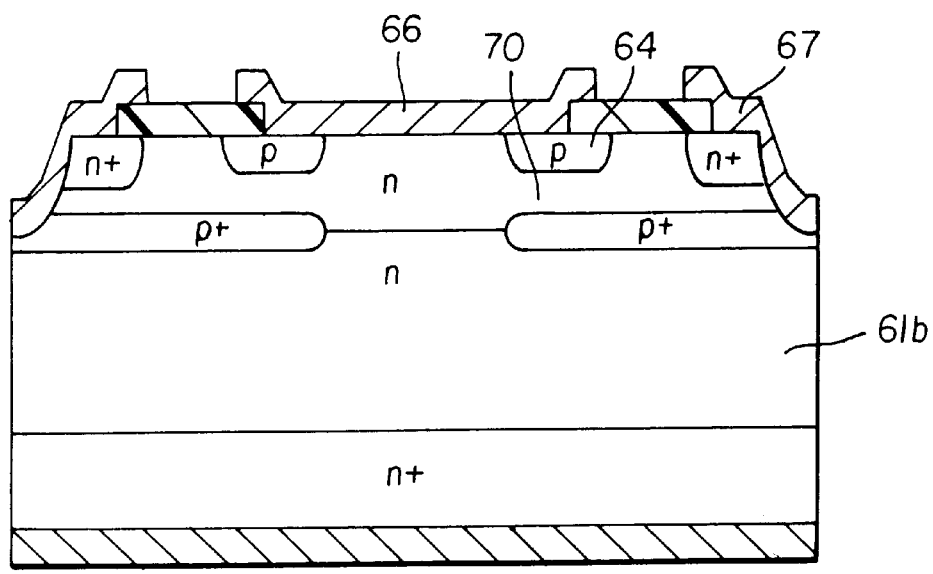
FIG. 5 is a cross-sectional view showing a JFET according to the third embodiment of the present invention.

FIG. 5 is a cross-sectional view of a SiC JFET according to the third embodiment of the present invention, which is another modified example of the SiC JFET of FIG. 1.

The SiC JFET of FIG. 5 is different from that of FIG. 1 in that the gate electrode 66 is held in contact with both the p gate region 64 and the surface of the n drift layer 61b. Here, the gate electrode 66 is formed of a metal, such as Ti, Al, Pt, that cooperates with the SiC substrate to form a Shottky junction.

In the JFET of the first embodiment, the gate electrode 46 contacts only with the p gate region 44 formed in the SiC substrate. The contact area between the gate electrode 46 and the p gate region 44 must be increased so as to reduce contact resistance, and the smallest value of the channel length is limited by the size of the contact hole or window that permits contact between these electrode and region 46, 44.

The JFET of the present embodiment is an improvement in terms of the channel length. Since the gate electrode 66 contacts with the surface of the n drift layer 61 as well as the p gate region 64, a relatively large area of contact portion can be provided, and thus the channel region can be designed to have a small length.

In the JFET of the third embodiment, too, the n+ source region is formed by self-alignment in the surface layer of the n drift layer, and the channel length can be formed with high uniformity and accuracy, assuring stable characteristics of the JFET and high yield.

It is to be noted that the metal used for forming the gate electrode 66 cooperates with the SiC substrate to form a Shottky junction, and is not necessarily the same as that of the source electrode 67. The gate electrode 66 may consist of two layers, one of which is in Shottky contact with the SiC substrate, and the other of which is the same as that of the source electrode 67. The process of manufacturing the JFET is almost the same as that of FIGS. 2 and 3, and therefore will not be explained herein.

Fourth Embodiment

Figure 6:
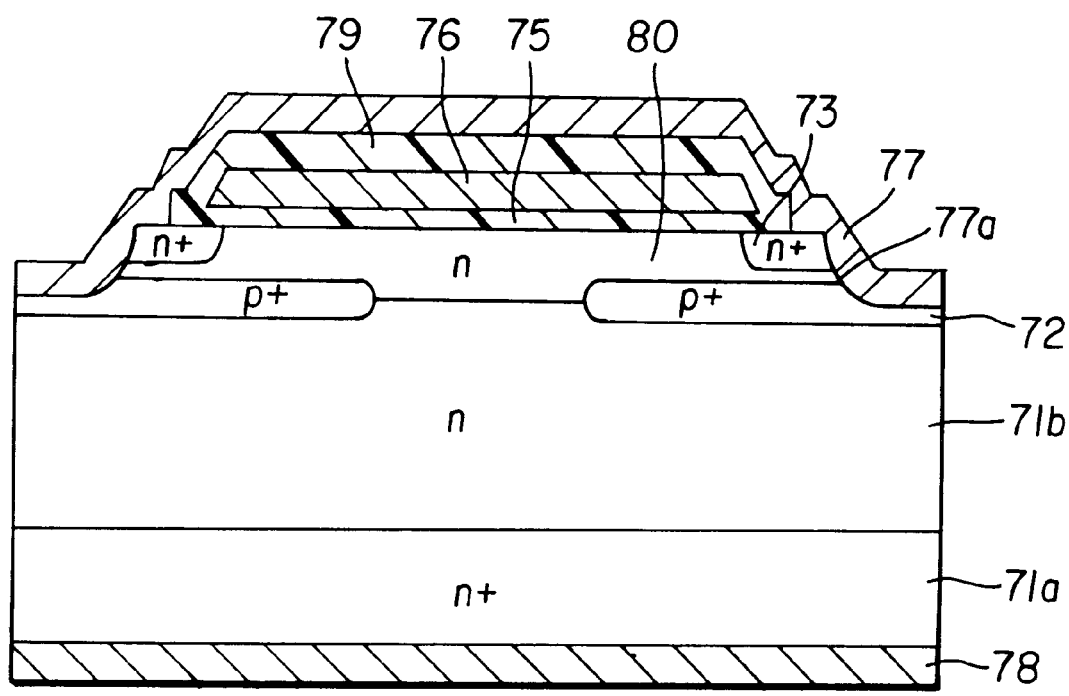
FIG. 6 is a cross-sectional view showing a MOSFET according to the fourth embodiment of the present invention.

FIG. 6 is a cross-sectional view showing a SiC MOSFET according to the fourth embodiment of the present invention. As in the illustrated embodiments, an n drift layer 71b is epitaxially grown on an n+ substrate 71a, to provide a wafer, and a p+ embedded region 72 is formed at a location that is spaced a small distance from the surface of the n drift layer 71b, while an n+ source region 73 is formed in a surface layer of the n drift layer 71b located above the p+ embedded region 72. In the present embodiment, no p gate region is provided, and a portion of the n drift layer 71b that is located above the p+ embedded region 72 forms an n channel region 80 on which a gate of MOS structure is provided.

Namely, a gate electrode layer 76 formed of polysilicon is formed above the surface of the n drift layer 71b, with a gate oxide film 75 interposed therebetween. An insulating film 79 made of boron/phosphorous/silica glass (BPSG) serves to insulate the gate electrode layer 76 from the source electrode 77. A recessed portion 77a extends from the surface of the n+ source region 73 to a certain depth, and a source electrode 77 is formed along the surface of the recessed portion 77a so as to contact with both the n+ source region 73 and the p+ embedded region 72. Also, the drain electrode 78 is formed in contact with the rear surface of the n+ substrate 71 a. The dimensions of the respective portions are almost the same as those of the first embodiment. In addition, the gate oxide film 75 has a thickness of 50 nm, and the gate electrode layer 76 has a thickness of 1 $\mu$m, while the insulating film 79 has a thickness of 2 $\mu$m.

The MOSFET of the present invention is also called "ACCUFET". When a positive voltage is applied to the gate electrode layer 76, an accumulation layer is induced in a surface portion of the n drift layer 71b located right under the gate electrode layer 76, and current flows between the drain electrode 78 and the source electrode 77. If a negative voltage is applied to the gate electrode layer 76, current flow between the drain electrode 78 and the source electrode 77 is interrupted or stopped. In this manner, the MOSFET performs a switching function. The voltage between the source and the drain is also applied between the p+ embedded region 72 and the n drift layer 71b, so that the device can hold a relatively large voltage, thus assuring a high breakdown voltage.

FIG. 7(a) through FIG. 2(e) and FIG. 8(a) through FIG. 8(d) are cross-sectional views showing the substrate surface portion of the SiC MOSFET of the fourth embodiment of FIG. 6 in the order of process steps for manufacturing the MOSFET.

Figure 7A:
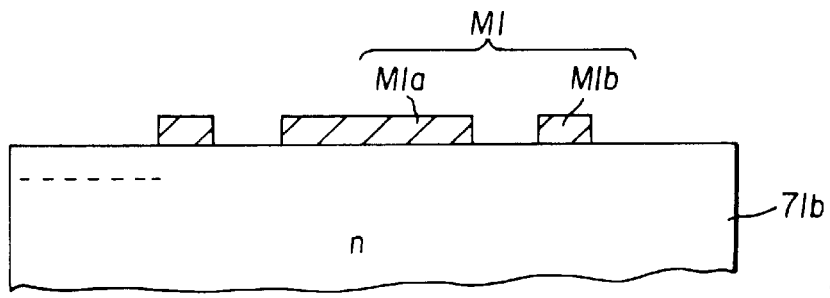
FIG. 7(a) through FIG. 7(e) are cross-sectional views showing process steps for manufacturing the MOSFET of the fourth embodiment as shown in FIG. 6.

Initially, the n drift layer 71b doped with phosphorous is epitaxially grown on the n+ substrate, to provide a 4H-SiC substrate. The impurity concentration and thickness of the n drift layer 71b may be substantially equal to those of the first embodiment. A polycrystalline silicon or polysilicon film is deposited on the surface of the n drift layer 71b by reduced-pressure CVD, and formed into a certain pattern by photolithography, to provide a first mask M1, as shown in FIG. 7(a). The first mask M1 consists of a central portion M1a and opposite side portions M1b. The first mask M1 is not necessarily formed from a polysilicon film, as in the first embodiment.

Figure 7B:
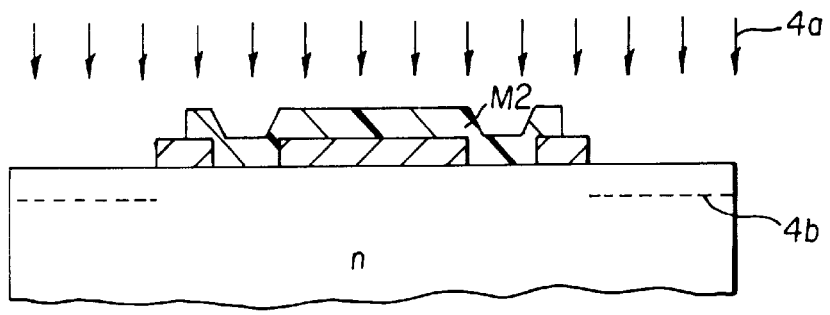

Subsequently, a SiO$_2$ film is deposited on the first mask M1 of the polysilicon film by thermal CVD, and patterned by photolithography, to provide a second mask M2, and ions, such as nitrogen (N) ions 4a, that provide n-type impurities are implanted into a region that is defined by the first and second masks M1, M2, as shown in FIG. 7(b). Thus, the n+ source region 73 is formed by implanting the nitrogen ions with the same accelerating-field voltage and dose amount as in the first embodiment. The second mask M2 is not necessarily formed of SiO$_2$ but need to be made of a material that is different from the material of the first mask M1 and permits selective etching, since the second mask M2 will be removed while leaving the first mask M1 in a later step. The second mask M2 may be easily positioned since its edge is only required to be located on the first mask M1. The n-type impurities may be selected from phosphorous (P) and other elements, as well as nitrogen (N).

Figure 7C:
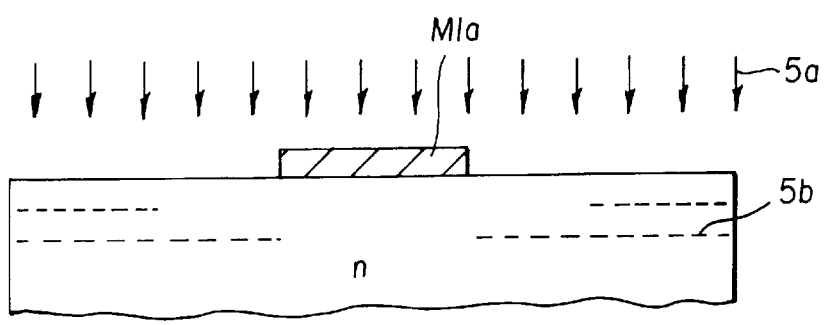

After removing the second mask M2 in the form of SiO$_2$ film, and leaving the inner portion M1a of the first mask by photolithography, ions, such as boron (B) ions 5a, that provide p-type impurities are implanted with an accelerating-field voltage of 400 keV and a dose amount of about $1 \times 10^{15}$ cm$^{-2}$, as shown in FIG. 7(c), so as to form the p+ embedded region 72. An increased accelerating-field voltage is employed so as to form a deep impurity region. The p-type impurities may be selected from aluminum (Al) and other materials, in addition to boron.

Figure 7D:
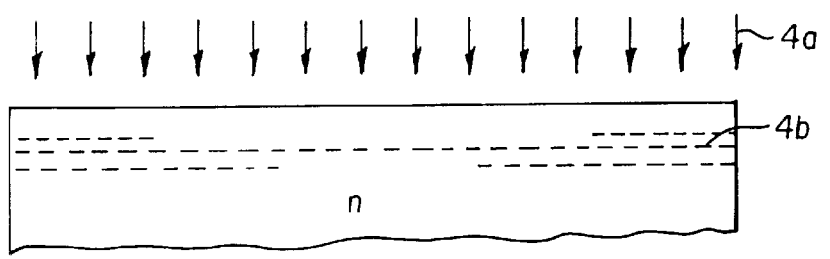

The remaining portion M1a of the first mask is then removed, and nitrogen (N) ions 4a are implanted with an accelerating-field voltage of 200 keV and a dose amount of about $1 \times 10^{12}$ cm$^{-2}$, as shown in FIG. 7(d), so as to control the impurity concentration of the n channel region 80.

Figure 7E:
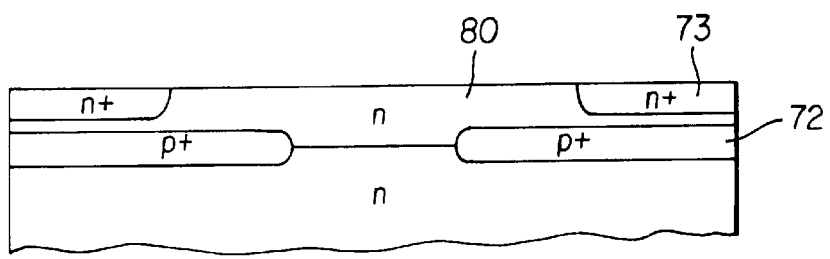

By conducting heat treatment at 1600° C. for two hours so as to activate the implanted impurities, the p+ embedded region 72, n+ source region 73 and the n channel region 80 are respectively formed as shown in FIG. 7(e).

Figure 8A:
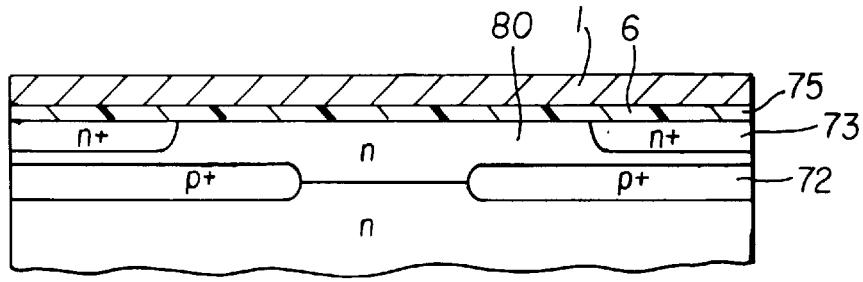
FIG. 8(a) through FIG. 8(d) are cross-sectional views showing process steps following the step of FIG. 7(e), for producing the MOSFET of the fourth embodiment.

Subsequently, a SiO$_2$ film 6 that provides the gate oxide film 75 is formed on the surface of the SiC substrate by conducting thermal oxidation at 1200° C. for two hours, and an about 1 $\mu$m-thickness polysilicon film 1 that provides the gate electrode layer 76 is deposited on the SiO$_2$ film or gate oxide film by reduced-pressure CVD, as shown in FIG. 8(a). The gate oxide film 75 may be formed by CVD, as well as thermal oxidation. The gate electrode layer 76 may be formed of other material, such as molybdenum (Mo).

Figure 8B:
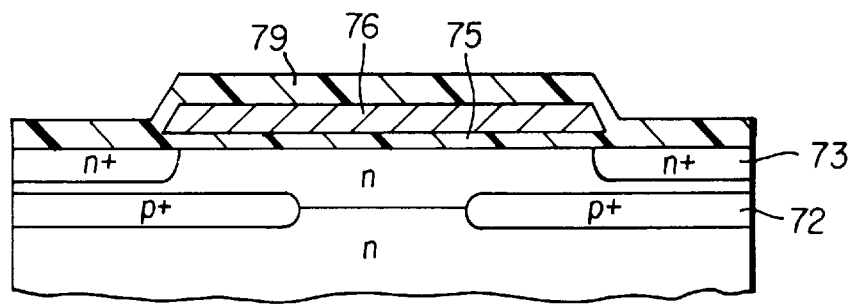

The polysilicon film 1 is coated with a photoresist, and patterned by photolithography, to form the gate electrode layer 76, and an insulating film 79 made of boron-phosphorous- silica glass (BPSG) or other material is deposited on the surfaces of the polysilicon film 1 and the gate oxide film 75, as shown in FIG. 8(b).

Figure 8C:
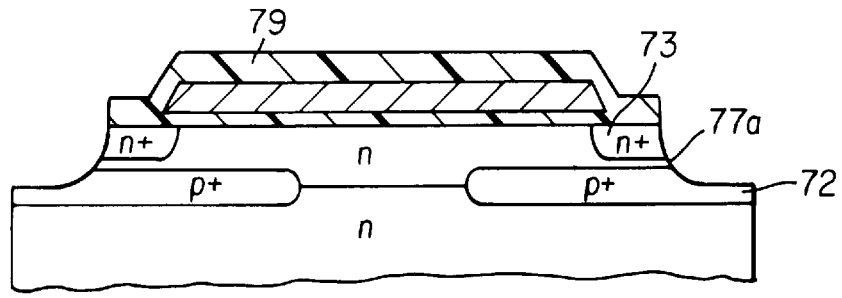

After patterning by photolithography, a recessed portion 77a is formed by reactive ion etching using mixed gases of carbon tetrafluoride (CF$_4$) and oxygen (O$_2$), so as to extend from the surface of the n+ source region 73 to the p+ embedded region 72, as shown in FIG. 8(c).

Figure 8D:
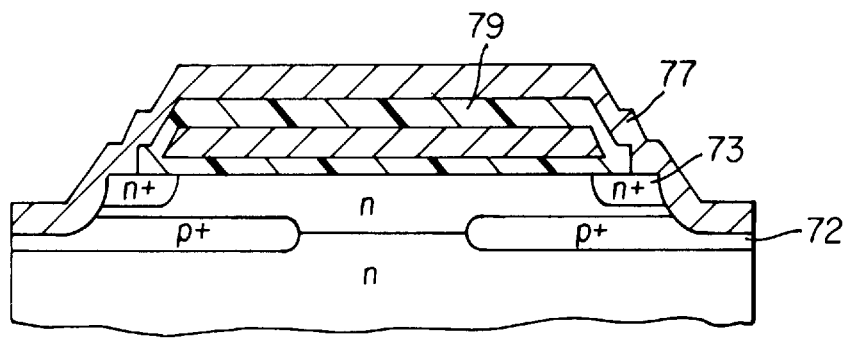

After forming contact holes or windows through the insulating film 79 by photolithography, an aluminum alloy film is formed by vapor deposition, and patterned, so as to provide the source electrode 77 and gate electrode (not shown), as shown in FIG. 8(d). A drain electrode is also provided on the rear surface of the n⁺ substrate, and the manufacturing process is completed.

In the MOSFET of the fourth embodiment, too, the n⁺ source region 73 is defined by the edge of the outer portion M1b of the first mask, and the edge of the p⁺ embedded region 72 is defined by the inner portion M1a of the first mask. Thus, the impurity regions are defined only by the first mask M1, and suitably positioned relative to each other, causing no problem of non-uniformity due to variations in position that would occur if the regions were defined by a plurality of masks.

Accordingly, the channel length of the MOSFET of the fourth embodiment is uniformly controlled to about 1.5 $\mu$m with high accuracy, assuring stable characteristics and high yield, as in the JFET of the first embodiment. Another advantage is that the dimensions of the respective impurity regions can be confirmed after the first mask M1 is formed.

By adding the step of implanting nitrogen (N) ions into the surface layer of the n drift layer 71b so as to control the impurity concentration, the threshold voltage of the MOSFET can be controlled as desired, and, in particular, a normally-off type FET can be provided.

In the present embodiment, the gate oxide film 75 is formed on the SiC substrate to extend over the plane of the substrate, and therefore the device is free from a problem as encountered in known trench-type MOSFET, namely, concentration of stresses of an electric field at corner portions of gate oxide films. Thus, the present device ensures a high breakdown voltage.

The manufacturing method as described above may be modified in several ways. For example, the ion implantation for controlling the impurity concentration of the n channel region 80 may be initially conducted, or the order of formation of the second mask M2 and the third mask M3 may be reversed.

If nitrogen (N) ions are implanted so as to form the n⁺ source region 73, using a mask that defines the outer edge of the n⁺ source region 73, and boron (B) ions are then implanted so as to form a p⁺ contact region 52a, as shown in FIG. 4, using another mask, the recessed portion 77a need not be formed, and the source electrode can be formed on the surface of the substrate. In this case, too, the length of the channel region can be uniformly controlled with high accuracy, as in the SiC MOSFET of the fourth embodiment, assuring stable characteristics and high yield.

Fifth Embodiment

Figure 9:
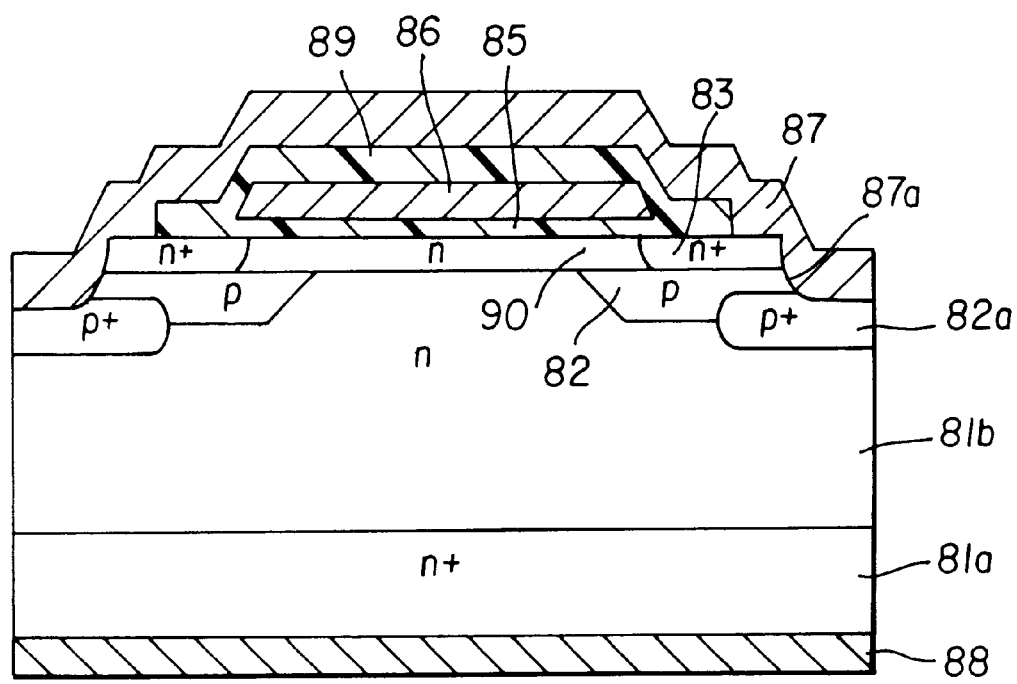
FIG. 9 is a cross-sectional view showing a MOSFET according to the fifth embodiment of the invention.

FIG. 9 is a cross-sectional view of a SiC MOSFET according to the fifth embodiment of the present invention.

In the SiC MOSFET of the present embodiment, an n drift layer 81b is epitaxially grown on an n⁺ substrate 81a, to provide a wafer, and a p⁺ contact region 82a is formed at a location that is spaced a small distance from the surface of the n drift layer 81b. Also, a p base region 82 is formed in a surface layer of the n drift layer 81b above the p⁺ contact region 82a, and an n⁺ source region 83 is formed on a selected area of the surface of the p base region 82. The p base region 82 is characterized in that the junction depth of its end portion is almost linearly reduced as the distance from the n⁺ source region 83 increases, namely, the end portion of the p base region 82 is tapered in the direction away from the n⁺ source region 83. The p⁺ contact region 82a is formed in a portion of the substrate that is deeper than the p base region 82, so as to overlap the p base region 82. An n channel region 90 is provided on a part of the p base region 82 on which the n⁺ source region 83 is not formed, and a gate of MOS structure similar to that of the MOSFET of FIG. 6 is provided on the n channel region 90. Namely, a gate electrode layer 86 that consists of a polysilicon layer is formed above the n channel region 90 with a gate oxide film 85 interposed therebetween. Reference numeral 89 denotes an insulating film made of BPSG that insulates the gate electrode layer 86 from a source electrode 87. A recessed portion 87a extends from the surface of the n⁺ source region 83 to a certain depth, and the source electrode 87 is formed in contact with both the n⁺ source region 83 and the p⁺ contact region 82a. Also, the drain electrode 88 is formed in contact with the rear surface of the n⁺ substrate 81a.

The dimensions of the respective layers or regions of the device may be determined as follows. The n⁺ substrate 81a has an impurity concentration of $1 \times 10^{18}$ cm⁻³ and a thickness of 350 $\mu$m, and the n drift layer 81b has an impurity concentration of $1 \times 10^{16}$ cm⁻³ and a thickness of 10 $\mu$m. The p base region 82 has the maximum impurity concentration of $5 \times 10^{16}$ cm⁻³ and a junction depth of 1.5 $\mu$m, and the spacing between the opposite p base regions 82 is about 6 $\mu$m. The n⁺ source region 83 has an impurity concentration of $1 \times 10^{19}$ cm⁻³, a junction depth of 0.2 $\mu$m, and a width of about 5 $\mu$m, and the p⁺ contact region 82a has the maximum impurity concentration of $1 \times 10^{19}$ cm⁻³, a junction depth of 2.0 $\mu$m, and a width of about 5 $\mu$m, while the n channel region 90 has an impurity concentration of $5 \times 10^{15}$ cm⁻³ and a junction depth of 0.5 $\mu$m. The spacing between the edge of the n⁺ source region 83 and the edge of the p base region 82 is about 2 $\mu$m. The recessed portion 87a has a depth of 0.7 $\mu$m as measured from the surface of the substrate, and a width of about 3 $\mu$m. The pitch of unit cell as shown in FIG. 9 is about 30 $\mu$m. The gate oxide film 85 has a thickness of 50 $\mu$m, and the gate electrode layer 86 has a thickness of 1 $\mu$m, while the insulating film 89 has a thickness of 2 $\mu$m.

FIG. 10(a) through FIG. 10(e) and FIG. 11(a) through FIG. 11(d) are cross-sectional views showing the vicinity of the surface of the SiC MOSFET of the fifth embodiment of FIG. 9 in the order of manufacturing steps, which will be explained below.

Initially, the n drift layer 81b doped with phosphorous is epitaxially grown on the n⁺ substrate, to provide a 4H-SiC substrate. A polysilicon film is deposited on the surface of the n drift layer 81b by reduced-pressure CVD, and patterned by photolithography, to provide a first mask M1.

When patterning the polysilicon film, it is important to form a tapered portion 8 over a 1–2 $\mu$m width of an end portion of the first mask M1. This is because the channel length is determined by the angle of the tapered portion 8 of the first mask M1 when the p base region is formed by ion implantation in the following step. Thus, the taper angle must be determined according to a desired design or configuration of the device. The angle of the tapered portion 8 can be controlled by selecting appropriate etching conditions under which a thin film of the first mask 1 is subjected to etching, such as plasma etching. In another method, the upper portion of the thin film is damaged through ion implantation, so that only the portion close to its surface is likely to be etched, to provide a relatively small taper angle. In this case, the taper angle may be controlled by controlling the dose amount of ion implantation.

Figure 10A:
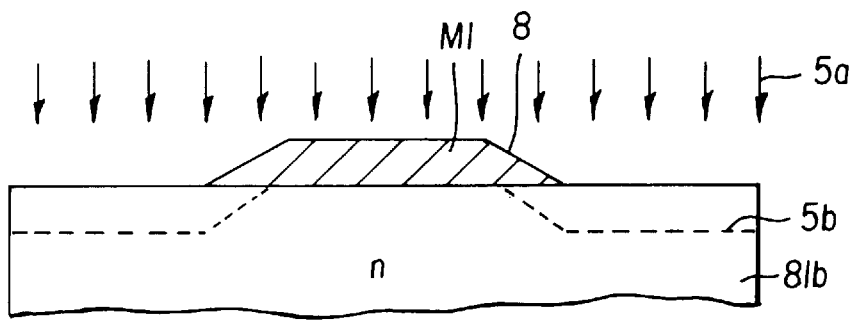
FIG. 10(a) through FIG. 10(e) are cross-sectional views showing process steps for producing the MOSFET of the fifth embodiment of FIG. 9.

Using the first mask M1, boron (B) ions 5a that provide p-type impurities are implanted into the SiC substrate with an accelerating-field voltage of 300 keV and a dose amount of about $1 \times 10^{15}$ cm⁻², as shown in FIG. 10(a), so as to form the p base region 82. In FIG. 10(a), reference numeral 5b denote boron atoms thus implanted. A relatively high accelerating-field voltage is employed in order to form a deep impurity region. The impurities are implanted to a large depth in a region that is not covered with the first mask M1, and the depth of the impurities is gradually and almost linearly reduced as the thickness of the first mask M1 increases, to thus provide a distribution of impurity atoms as shown in FIG. 10(a). If the first mask M1 has a relatively small thickness, the region containing the implanted ions does not reach the surface of the substrate, and provides an embedded impurity region. The p-type impurities may be selected from aluminum (Al) and other materials, in addition to boron (B). The first mask M1 is not necessarily formed from a polysilicon film, as in the first embodiment.

Figure 10B:
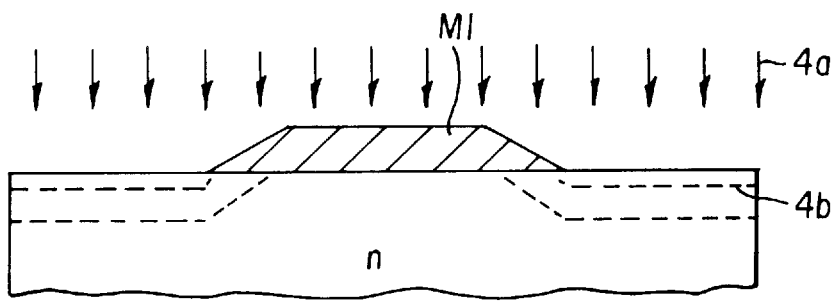

Using the first mask M1 as described above again, ions 4a, such as nitrogen (N) ions, that provide n-type impurities are then implanted with an accelerating-field voltage of 100 keV as employed in the first embodiment, and a dose amount of about $5 \times 10^{15}$ cm$^{-2}$, as shown in FIG. 10(b), so as to form the n$^+$ source region 83. In FIG. 10(b), reference numeral 4b denotes nitrogen atoms thus implanted. In this case, too, the impurities are implanted to a large depth in a region that is not covered with the first mask M1, and the depth of the impurities is gradually reduced with an increase in the thickness of the first mask M1, to provide a distribution of the impurity atoms as shown in FIG. 10(b). Since the accelerating-field voltage is lower than that in the previous step of FIG. 10(a), the region containing the nitrogen ions 4a is different from that containing the implanted boron ions 5a. If the tapered portion 8 has the same taper angle, the region in which the p-type impurities are implanted is spaced a constant distance from the region in which the n-type impurities are implanted.

Figure 10C:
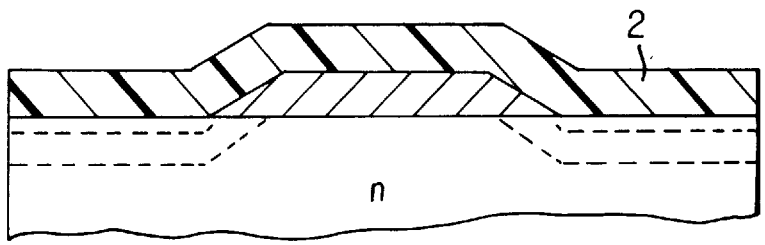
Figure 10D:
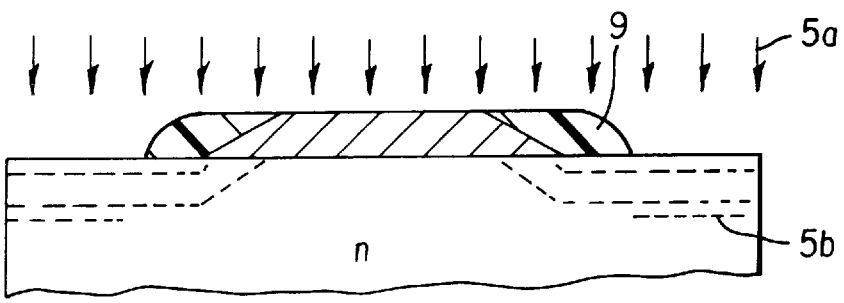

Subsequently, a SiO$_2$ film 2 is deposited on the first mask M1 of the polysilicon film by thermal CVD, as shown in FIG. 10(c). The entire area of the SiO$_2$ film 2 is then subjected to reactive ion etching (RIE), so that a side wall 9 is formed on the side of the tapered portion 8 of the first mask M1, and then ions 5a, such as boron (B) ions, that provide p-type impurities are implanted in a region that is defined by the first mask M1 and the side wall 9, as shown in FIG. 10(d). The ion implantation is conducted with an accelerating-field voltage of 400 keV and a dose amount of about $1 \times 10^{15}$ cm$^{-2}$, so as to form the p$^+$ contact region 82a having a high impurity concentration. The p-type impurities may be selected from aluminum (Al) and other materials, in addition to boron.

Figure 10E:
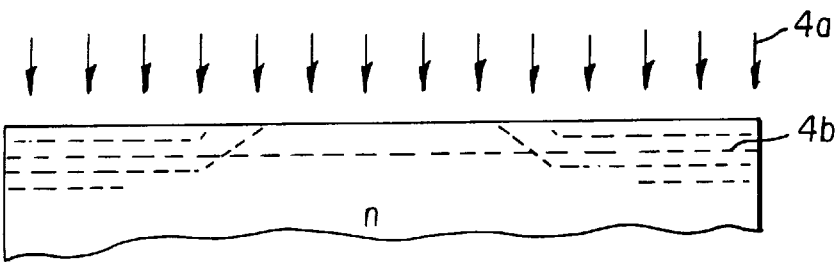

After removing the first mask M1 and the side wall 9, nitrogen (N) ions 4a are implanted over the entire surface area of the SiC substrate, as shown in FIG. 10(e), with an accelerating-filed voltage of 200 keV and a dose amount of about $1 \times 10^{12}$ cm$^{-2}$, so as to control the impurity concentration of the n channel region 90. In this manner, the threshold value, for example, can be controlled.

Figure 11A:
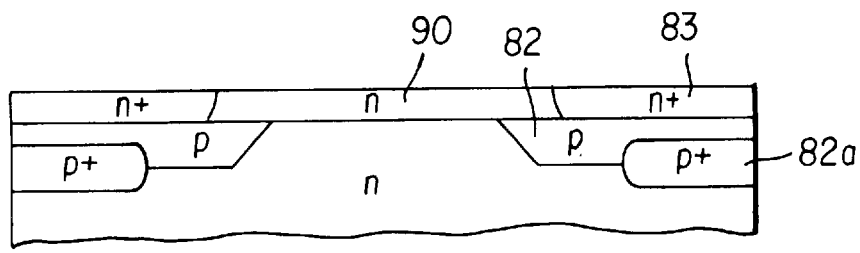
FIG. 11(a) through FIG. 11(e) are cross-sectional views showing process steps following the step of FIG. 10(e), for producing the MOSFET of the fifth embodiment.

By conducting heat treatment at 1600° C. for two hours so as to activate the implanted impurities, the p base region 82, n$^+$ source region 83, p$^+$ contact region 82a, and the n channel region 90 are formed as shown in FIG. 11(a), such that the p base region 82 and the n$^+$ source region 83 are shifted in position from each other.

Figure 11B:
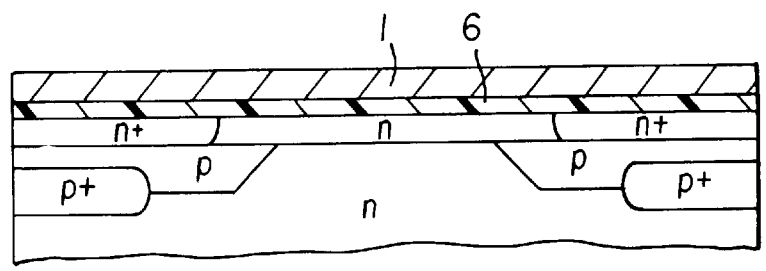

Subsequently, a 50 nm-thickness SiO$_2$ film 6 that provides the gate oxide film 85 is formed on the surface of the SiC substrate by conducting thermal oxidation at 1200° C. for two hours, and an about 1 μm-thickness polysilicon film 1 is deposited on the SiO$_2$ film or gate oxide film by reduced-pressure CVD, as shown in FIG. 11(b). The gate oxide film 85 may also be formed by CVD, as well as thermal oxidation.

Figure 11C:
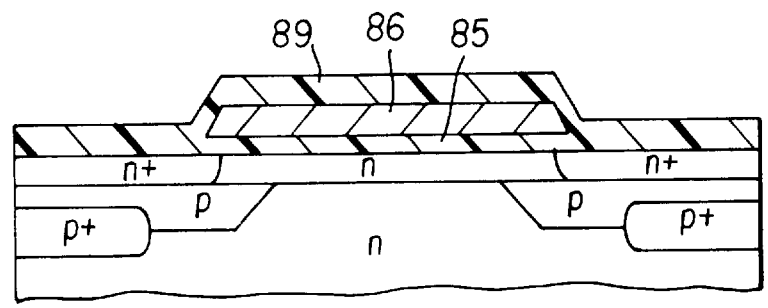

The polysilicon film 1 is coated with a photoresist, and patterned by photolithography, to thus form the gate electrode layer 86, and an insulating film 89 made of boron-phosphorous- silica glass (BPSG) or other material is deposited on the surfaces of the gate electrode layer 86 and the gate oxide film 85, and patterned by photolithography, as shown in FIG. 11(c).

Figure 11D:
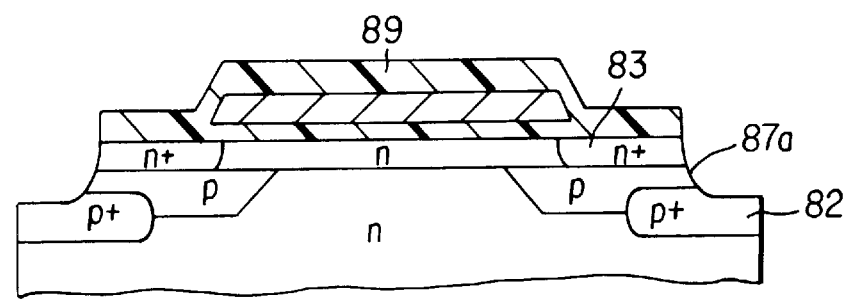

In the next step, a recessed portion 87a is formed by reactive ion etching (RIE) using mixed gases of carbon tetrafluoride (CF$_4$) and oxygen (O$_2$), so as to extend from the surface of the n$^+$ source region 83 to the p$^+$ contact region 82a, as shown in FIG. 11(d).

Figure 11E:
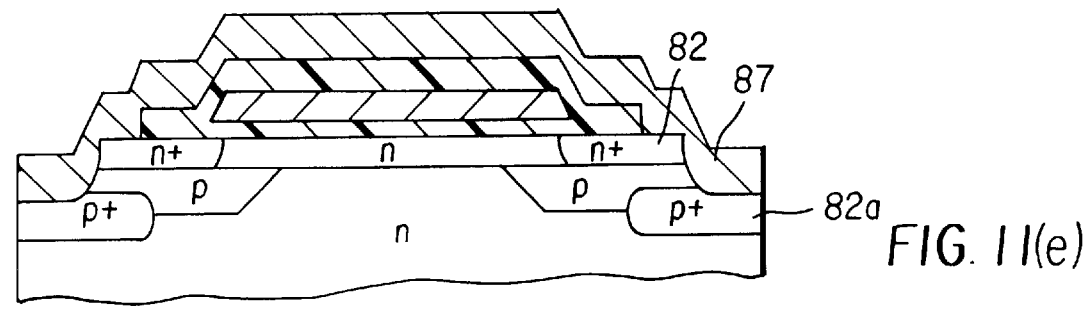

After forming contact holes or windows through the insulating film 89 by photolithography, an aluminum alloy film is formed by vapor deposition, and patterned, so as to provide the source electrode 87 and a gate electrode (not shown), as shown in FIG. 11(e). A drain electrode is also provided on the rear surface of the n$^+$ substrate, and the manufacturing process is completed.

In the MOSFET of the fifth embodiment, the end portion of the first mask M1 is tapered, and different accelerating-field voltages are used for implanting p-type impurities and n-type impurities, so that the edges of the n$^+$ source region 83 and the p base region 82 are respectively defined by the first mask M1. Namely, the length of the channel provided by the spacing between these regions 83, 82 is determined by the tapered portion 8 of the first mask M1. Thus, the impurity regions are defined only by the first mask M1, and suitably positioned relative to each other, causing no problem of non-uniformity due to variations in position that would occur if the regions were defined by a plurality of masks.

Accordingly, the channel length of the MOSFET of the present embodiment can be uniformly controlled with high accuracy, assuring stable characteristics and high yield. Also, the spacing between the n$^+$ source region 83 and the p base region 82, namely, the length of the channel region, can be freely controlled by varying the angle of the tapered portion 8 of the first mask M1, which makes it easy to balance the ON-state resistance and the breakdown voltage. Another advantage is that the dimensions of the respective impurity regions can be confirmed after the formation of the first mask M1.

By adding the step of implanting nitrogen (N) ions into the surface layer of the n drift layer 81b so as to control the impurity concentration, the threshold voltage of the MOSFET can be controlled as desired, and, in particular, a normally-off type FET can be provided.

The manufacturing method as described above may be modified in several ways. For example, the ion implantation for controlling the impurity concentration of the n channel region 90 may be initially conducted. Also, the implantation of the boron (B) ions for forming the p base region 82 and the implantation of the nitrogen (N) ions for forming the n$^+$ source region 83 may be conducted in the reverse order. As another modification, the side wall region may be initially formed, and then the ion implantation for forming the p$^+$ contact region 82a may be conducted.

In the present embodiment, too, the gate oxide film 85 is formed on the SiC substrate to extend over the plane of the SiC substrate, and therefore the device is free from a problem as encountered in known trench-type MOSFET, namely, the concentration of stresses of an electric field at corner portions of gate oxide films, thus assuring a high breakdown voltage.

While the p$^+$ contact region 82a is formed as an embedded region in the present embodiment, a mask that defines the outer edge of the n$^+$ source region 83 may be used when implanting the nitrogen (N) ions to form the n$^+$ source region 83, and the p-type ions are subsequently implanted so as to from the p⁺ contact region 82 that reaches the surface of the substrate, so that the source electrode 87 can be provided on the substrate surface, without requiring the formation of the recessed portion 87a.

Sixth Embodiment

FIG. 12(a) through FIG. 12(e) are cross-sectional views useful in explaining another method for manufacturing a SiC MOSFET that is almost the same as the SiC MOSFET of FIG. 9, showing the vicinity of the substrate surface of the MOSFET in the order of process steps.

Initially, an n drift layer 91b doped with phosphorous is epitaxially grown on an n⁺ substrate, to prepare a 4H-SiC substrate. The impurity concentration and the thickness of the n drift layer 91b may be the same as those of the first embodiment. A $SiO_2$ film having a thickness of about 2 $\mu$m is deposited on the surface of the n drift layer 91b by plasma CVD, and patterned by photolithography, so as to provide a third mask M3.

Figure 12A:
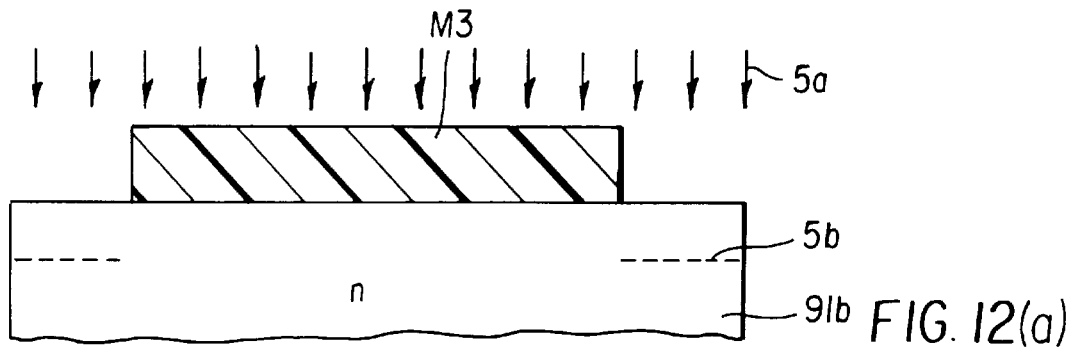
FIG. 12(a) through FIG. 12(e) are cross-sectional views showing process steps for producing a MOSFET according to the sixth embodiment of the present invention.

Using the third mask M3, ions 5a, such as boron (B) ions, that provide p-type impurities are implanted, as shown in FIG. 12(a), with an accelerating-filed voltage of 400 keV and a dose amount of about $1 \times 10^{15}$ cm⁻², so as to form a p⁺ contact region 94. In FIG. 12(a), reference numeral 5b denotes boron (B) atoms. The p-type impurities may be selected from aluminum (Al) and other materials, in addition to boron.

Figure 12B:
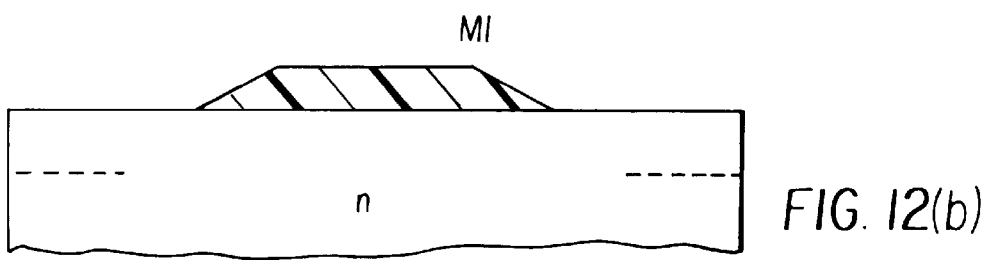

Subsequently, the third mask M3 is etched back by plasma etching using $CF_4+H_2$ gas, so as to form a first mask M1 whose end portion is tapered over a width of 1 to 2 $\mu$m, as shown in FIG. 12(b). As a result of etching, the thickness of the entire area of the mask is reduced to about 1 $\mu$m. When a p base region is formed by ion implantation in the next step, therefore, the channel length can be controlled by controlling the taper angle of the end portion of the first mask, as in the case of the SiC MOSFET of the fifth embodiment.

Figure 12C:
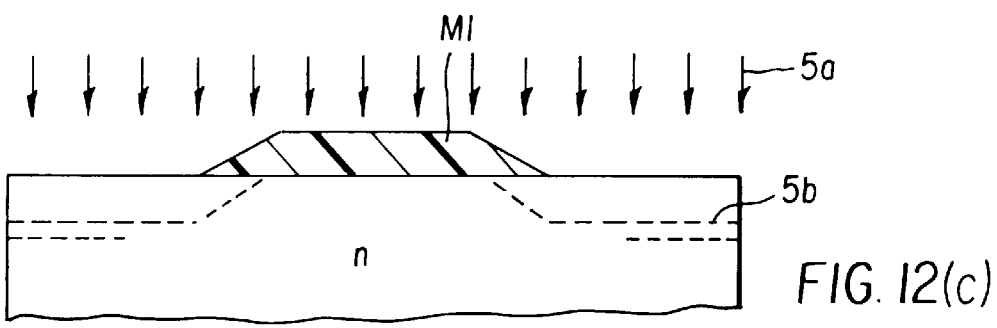

Using the first mask M1 having the tapered end portion, ions 5a, such as boron (B) ions, that provide p-type impurities are implanted with an accelerating-field voltage of 300 keV and a dose amount of about $1 \times 10^{15}$ cm⁻², as shown in FIG. 12(c), so as to form a p base region 92. The impurities are implanted to a larger depth in a region that is not covered with the first mask M1, and the depth of the impurities is gradually reduced as the thickness of the first mask M1 increases, to provide a distribution of the impurity atoms as shown in FIG. 12(c).

Figure 12D:
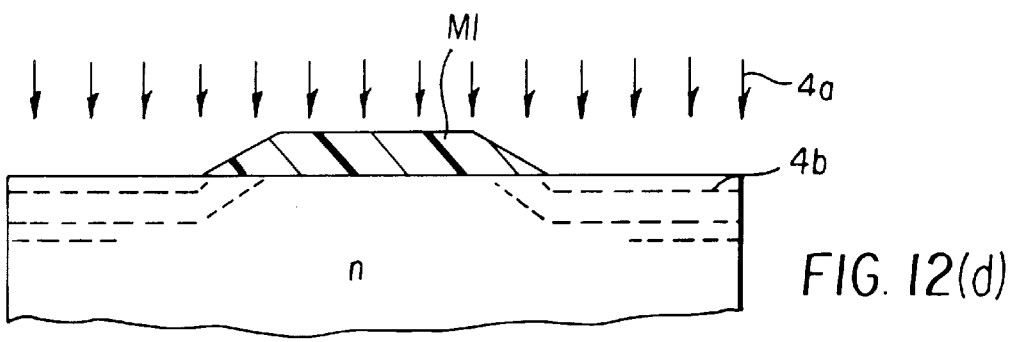

Using the same first mask M1 having the tapered end portion, ions 4a, such as nitrogen (N) ions, that provide n-type impurities are then implanted as shown in FIG. 12(d), with an acceleration voltage of 100 keV and a dose amount of about $5 \times 10^{15}$ cm⁻², so as to form an n⁺ source region 93. Since the accelerating-field voltage is lower than that in the previous step of FIG. 12(c), the region containing the n-type impurities is different from that containing the p-type impurities.

Figure 12E:
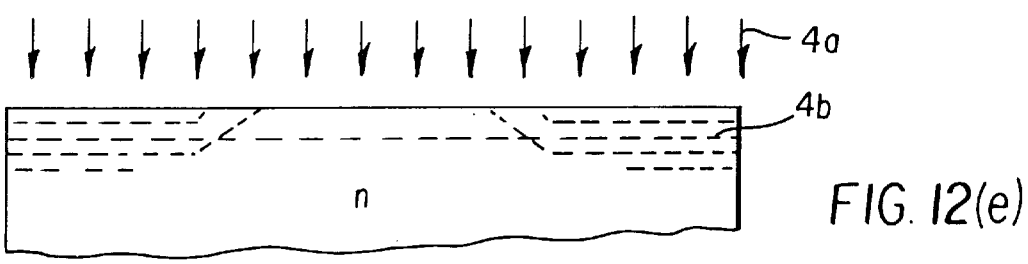

After removing the first mask M1, nitrogen (N) ions 4a are implanted over the entire surface area of the SiC substrate, as shown in FIG. 12(e), with an accelerating-filed voltage of 200 keV and a dose amount of about $1 \times 10^{12}$ cm⁻², so as to control the impurity concentration of an n channel region formed in the surface layer of the n drift layer 91b. In this manner, the threshold value can be controlled.

In the following steps, the impurities implanted in the steps of FIG. 10(a) through FIG. 10(e) are activated, and source, gate and drain electrodes are formed.

According to the method as described above, the first mask M1 is formed by etching back the third mask M3, eliminating a need to prepare another mask material for the first mask M1. Since the spacing between the p base region 92 and the n source region 93 is determined by the uniform angle of the tapered portion of the first mask M1, these regions 92, 93 are suitably positioned relative to each other, causing no problem of non-uniformity due to variations in position that would occur if the regions were defined by a plurality of masks. Consequently, the channel length can be formed with high uniformity and accuracy, assuring stable characteristics of the device and high yield.

The manufacturing method as described above may be modified in several ways. For example, the implantation of the p-type impurities for forming the p base region (FIG. 12(c)) and the implantation of the n-type impurities for forming the n source region (FIG. 12(d)) may be conducted in the reverse order, and the ion implantation for controlling the impurity concentration of the n channel region (FIG. 12(e)) may be initially conducted.

As described above, in the method for forming a silicon carbide vertical FET according to the present invention, the first mask and the second mask that overlaps the first mask are used so that a first conductivity type impurity region is defined by one end of a certain portion of the first mask, and the portion of the first mask and the second mask are then removed so that a second conductivity type impurity region is defined by another portion of the first mask. Thus, the first conductivity type impurity region and the second conductivity type impurity region are suitably positioned relative to each other, with respect to the first mask.

If a mask including a tapered end portion is used, and ion implantation is conducted with different accelerating-field voltages, the first conductivity type region and the second conductivity type region may be formed by self-alignment, to be suitably positioned relative to each other, using only one mask.

By controlling the impurity concentration of the channel region, the threshold voltage can be controlled, and a normally-off type FET can be provided.

According to the method of the present invention, the channel region of JFET or MOSFET can be controlled with high accuracy, which was extremely difficult in conventional devices, thus assuring reduced ON-state resistance.

The method of the present invention can be effectively applied to CMOS-IC and other SiC semiconductor devices, as well as the respective types of FET as described above, thus making it easy to produce silicon carbide semiconductor devices having a sufficiently high voltage.

What is claimed is:

1. A method for manufacturing a silicon carbide vertical FET, comprising the steps of:

laminating a first conductivity type drift layer comprising silicon carbide, on a first conductivity type silicon carbide substrate;

forming a second conductivity type gate region and a first conductivity type source region in mutually spaced, selected portions of a surface layer of said first conductivity type drift layer;

forming a second conductivity type embedded region in a selected portion below said second conductivity type gate region and said first conductivity type source region;

forming a gate electrode layer in contact with a surface of said second conductivity type gate region;

forming a source electrode in contact with surfaces of both of said first conductivity type source region and said second conductivity type embedded region; and forming a drain electrode on a rear surface of said silicon carbide substrate, wherein said first conductivity type source region, said second conductivity type gate region and said second conductivity type embedded region are respectively formed using a first mask including a first portion and a second portion, such that one end of the first conductivity type source region is defined by one of opposite ends of the first portion of the first mask, and the second conductivity type gate region is defined by the other end of the first portion of the first mask, and the second portion of the first mask, while an end of the second conductivity type embedded portion is defined by the second portion of the first mask.

2. A method for manufacturing a silicon carbide vertical FET, comprising the steps of:

preparing a silicon carbide substrate by epitaxially growing a first conductivity type drift layer comprising silicon carbide, on a first conductivity type silicon carbide substrate;

forming a first mask on a surface of said first conductivity type drift layer;

forming a second mask made of a different material from that of said first mask, such that the second mask overlaps the first mask;

introducing impurities so as to form a first conductivity type source region in a selected portion of a surface layer of said first conductivity type drift layer, using said first mask and said second mask;

removing said second mask;

forming a third mask made of a different material from that of said first mask, such that the third mask overlaps the first mask;

introducing impurities so as to form a second conductivity type gate region in a selected portion of a surface layer of said first conductivity type drift layer, using said first mask and said third mask;

removing a first portion of said first mask and said third mask while leaving a second portion of the first mask;

introducing impurities so as to form a second conductivity type embedded region in a selected portion of the surface layer of said first conductivity type drift layer, using said second portion of said first mask;

removing said second portion of said first mask;

introducing first conductivity type impurities over an entire area of the surface layer of said first conductivity type drift layer so as to control an impurity concentration of a channel region in a surface of said first conductivity type drift layer;

conducting heat treatment for activating the introduced impurities;

forming a fourth mask on a surface of said silicon carbide substrate;

forming a recessed portion that extends from a surface of said first conductivity type source region to said second conductivity type embedded region, using said fourth mask;

forming a fifth mask comprising an insulating material; and vapor-depositing a metallic film so as to form a gate electrode, a source electrode and a drain electrode.

3. A method for manufacturing a silicon carbide vertical FET according to claim 2, wherein the impurities are introduced so as to form said first conductivity type source region, said second conductivity type gate region, and said second conductivity type embedded region, and so as to control an impurity concentration of said channel region, by implanting ions into the selected portions of the surface layer of said first conductivity type drift layer.

4. A method for manufacturing a silicon carbide vertical FET according to claim 2, further comprising a step of providing an electrode that cooperates with a surface of the first conductivity type drift layer to form a Shottky junction.

5. A method for manufacturing a silicon carbide vertical FET, comprising the steps of:

preparing a silicon carbide substrate by epitaxially growing a first conductivity type drift layer comprising silicon carbide, on a first conductivity type silicon carbide substrate;

forming a first mask on a surface of said first conductivity type drift layer;

forming a second mask made of a different material from that of said first mask, such that the second mask overlaps the first mask;

introducing impurities so as to form a first conductivity type source region in a selected portion of a surface layer of said first conductivity type drift layer, using said first mask and said second mask;

removing said second mask;

forming a third mask made of a different material from that of said first mask, such that the third mask overlaps the first mask;

introducing impurities so as to form a second conductivity type gate region in a selected portion of a surface layer of said first conductivity type drift layer, using said first mask and said third mask;

removing a first portion of said first mask and said third mask while leaving a second portion of the first mask;

introducing impurities so as to form a second conductivity type embedded region in a selected portion of the surface layer of said first conductivity type drift layer, using said second portion of said first mask;

forming a fourth mask on a surface of said silicon carbide substrate;

introducing impurities so as to form a second conductivity type contact region that reaches said second conductivity type embedded region, using said fourth mask;

removing said second portion of said first mask and said fourth mask;

introducing first conductivity type impurities over an entire area of the surface layer of said first conductivity type drift layer so as to control an impurity concentration of a channel region in a surface layer of said first conductivity type drift layer;

conducting heat treatment for activating the introduced impurities;

forming a fifth mask comprising an insulating material; and vapor-depositing a metallic film, so as to form a gate electrode, a source electrode and a drain electrode.

6. A method for manufacturing a silicon carbide vertical FET according to claim 5, further comprising a step of providing an electrode that cooperates with a surface of the first conductivity type drift layer to form a Shottky junction.

7. A method for manufacturing a silicon carbide vertical FET according to claim 5, wherein the impurities are introduced so as to form said first conductivity type source region, said second conductivity type gate region, said second conductivity type embedded region and said second conductivity type contact region, and so as to control an impurity concentration of said channel region, by implanting ions into the selected portions of the surface layer of said first conductivity type drift layer.

8. A method for manufacturing a silicon carbide vertical FET, comprising the steps of:

laminating a first conductivity type drift layer comprising silicon carbide, on a first conductivity type silicon carbide substrate;

forming a first conductivity type source region in a selected portion of a surface layer of said first conductivity type drift layer;

forming a second conductivity type embedded region in a selected portion below said first conductivity type source region;

forming a gate electrode layer on a gate insulating film that is formed on a surface of said first conductivity type drift layer;

forming a source electrode in contact with surfaces of both of said first conductivity type source region and said second conductivity type embedded region; and forming a drain electrode on a rear surface of said silicon carbide substrate, wherein said first conductivity type source region and said second conductivity type embedded region are respectively formed using a first mask including a first portion and a second portion, such that one end of the first conductivity type source region is defined by the first portion of the first mask, and the second conductivity type embedded region is defined by the second portion of the first mask.

9. A method for manufacturing a silicon carbide vertical FET, comprising the steps of:

preparing a silicon carbide substrate by epitaxially growing a first conductivity type drift layer comprising silicon carbide, on a first conductivity type silicon carbide substrate;

forming a first mask on a surface of said first conductivity type drift layer;

forming a second mask made of a different material from that of said first mask, such that the second mask overlaps the first mask;

introducing impurities so as to form a first conductivity type source region in a selected portion of a surface layer of said first conductivity type drift layer, using said first mask and said second mask;

removing a first portion of said first mask and said second mask, while leaving a second portion of the first mask;

introducing impurities so as to form a second conductivity type embedded region in a selected portion of the surface layer of said first conductivity type drift layer;

removing said second portion of said first mask;

introducing first conductivity type impurities over an entire area of the surface layer of said first conductivity type drift layer so as to control an impurity concentration of a channel region in a surface layer of said first conductivity type drift layer;

conducting heat treatment for activating the introduced impurities;

forming a gate oxide film on a surface of said silicon carbide substrate by thermal oxidation;

depositing a polysilicon layer on said gate oxide film, and patterning the polysilicon layer;

forming a third mask after covering said polysilicon layer and said gate oxide film with an insulating film;

forming a recessed portion that extends from a surface of said first conductivity type source region to said second conductivity type embedded region, using said third mask; and forming contact holes through said insulating film, and vapor-depositing metallic films so as to form a gate electrode that contacts with said polysilicon layer, a source electrode that contacts with said first conductivity type source region and said second conductivity type embedded region, and a drain electrode that contacts with said silicon carbide substrate.

10. A method for manufacturing a silicon carbide vertical FET according to claim 9, wherein the impurities are introduced so as to form said first conductivity type source region, said second conductivity type embedded region, and so as to control an impurity concentration of said channel region, by implanting ions into the selected portions of the surface layer of said first conductivity type drift layer.

11. A method for manufacturing a silicon carbide vertical FET, comprising the steps of:

preparing a silicon carbide substrate by epitaxially growing a first conductivity type drift layer comprising silicon carbide, on a first conductivity type silicon carbide substrate;

forming a first mask on a surface of said first conductivity type drift layer;

forming a second mask made of a different material from that of said first mask, such that the second mask overlaps the first mask;

introducing impurities so as to form a first conductivity type source region in a selected portion of a surface layer of said first conductivity type drift layer, using said first mask and said second mask;

removing a first portion of said first mask and said second mask, while leaving a second portion of the first mask;

introducing impurities so as to form a second conductivity type embedded region in a selected portion of the surface layer of said first conductivity type drift layer;

forming a third mask on a surface of said silicon carbide substrate;

introducing impurities so as to form a second conductivity type contact region that reaches said second conductivity type embedded region, using said third mask;

removing said second portion of said first mask and said third mask;

introducing first conductivity type impurities over an entire area of the surface layer of said first conductivity type drift layer so as to control an impurity concentration of a channel region in a surface layer of said first conductivity type drift layer;

conducting heat treatment for activating the introduced impurities;

forming a gate oxide film on a surface of said silicon carbide substrate by thermal oxidation;

depositing a polysilicon layer on said gate oxide film, and patterning the polysilicon layer;

covering said polysilicon layer and said gate oxide film with an insulating film; and forming contact holes through said insulating film, and vapor-depositing metallic films so as to form a gate electrode that contacts with said polysilicon layer, a source electrode that contacts with said first conductivity type source region and said second conductivity type contact region, and a drain electrode that contacts with said silicon carbide substrate.

12. A method for manufacturing a silicon carbide vertical FET according to claim 11, wherein the impurities are introduced so as to form said first conductivity type source region, said second conductivity type gate region, said second conductivity type embedded region and said second conductivity type contact region, and so as to control an impurity concentration of said channel region, by implanting ions into the selected portions of the surface layer of said first conductivity type drift layer.

13. A method for manufacturing a silicon carbide vertical FET, comprising the steps of:

laminating a first conductivity type drift layer comprising silicon carbide, on a first conductivity type silicon carbide substrate;

forming a first conductivity type source region in a selected portion of a surface layer of said first conductivity type drift layer;

forming a second conductivity type base region in a selected portion below said first conductivity type source region;

forming a gate electrode layer on a gate insulating film that is formed on a surface of said first conductivity type drift layer;

forming a source electrode in contact with surfaces of both of said first conductivity type source region and said second conductivity type base region; and forming a drain electrode on a rear surface of said silicon carbide substrate, wherein said first conductivity type source region and said second conductivity type base region are respectively formed using a first mask including a tapered end portion that has a small-thickness end having a first thickness, and a large-thickness end having a second thickness that is larger than said first thickness, such that one end of said first conductivity type source region is defined by said small-thickness end of said tapered end portion of said first mask, and an end of said second conductivity type base region is defined by said large-thickness end of said tapered end portion of said first mask.

14. A method for manufacturing a silicon carbide vertical FET, comprising the steps of:

preparing a silicon carbide substrate by epitaxially growing a first conductivity type drift layer comprising silicon carbide, on a first conductivity type silicon carbide substrate;

forming a first mask on a surface of said first conductivity type drift layer, said first mask including a tapered end portion that has a small-thickness end having a first thickness, and a large-diameter end having a second thickness that is larger than said first thickness;

introducing impurities so as to form a second conductivity type base region in a selected portion of a surface layer of said first conductivity type drift layer, using said first mask, such that the second conductivity type base region is defined by said large-thickness end of said tapered end portion of said first mask;

introducing impurities so as to form a first conductivity type source region in a selected portion of the surface layer of said first conductivity type drift layer, using said first mask, such that the first conductivity type source region is defined by said small-thickness end of said tapered end portion of said first mask;

forming a third mask on a surface of said silicon carbide substrate;

introducing impurities so as to form a second conductivity type contact region that reaches said second conductivity type base region, using said third mask;

removing said first mask and said third mask;

introducing first conductivity type impurities over an entire area of the surface layer of said first conductivity type drift layer so as to control an impurity concentration of a channel region in a surface layer of said first conductivity type drift layer;

conducting heat treatment for activating the introduced impurities;

forming a gate oxide film on a surface of said silicon carbide substrate by thermal oxidation;

depositing a polysilicon layer on said gate oxide film, and patterning the polysilicon layer;

forming contact holes through said insulating film after covering said polysilicon layer and said gate oxide film with an insulating film, and vapor-depositing metallic films so as to form a gate electrode that contacts with said polysilicon layer, a source electrode that contacts with said first conductivity type source region and said second conductivity type contact region, and a drain electrode that contacts with said silicon carbide substrate.

15. A method for manufacturing a silicon carbide vertical FET according to claim 14, wherein a side wall is formed on a side face of said first mask, and the first mask and the side wall constitute said third mask.

16. A method for manufacturing a silicon carbide vertical FET according to claim 14, wherein, after executing the step of forming said third mask so as to form the second conductivity type contact region that reaches the second conductivity type base region, and the step of introducing impurities, using the third mask, the third mask is etched back so as to provide the first mask having the tapered end portion.

17. A method for manufacturing a silicon carbide vertical FET according to claim 14, wherein the impurities are introduced so as to form said first conductivity type source region, said second conductivity type gate region, said second conductivity type embedded region and s aid second conductivity type contact region, and so as to control an impurity concentration of said channel region, by implanting ions into the selected portions of the surface layer of said first conductivity type drift layer.

18. A method for manufacturing a silicon carbide vertical FET, comprising the steps of:

preparing a silicon carbide substrate by epitaxially growing a first conductivity type drift layer comprising silicon carbide, on a first conductivity type silicon carbide substrate;

forming a first mask on a surface of said first conductivity type drift layer, said first mask including a tapered end portion that has a small-thickness end having a first thickness, and a large-thickness end having a second thickness that is larger than said first thickness;

introducing impurities so as to form a first conductivity type source region in a selected portion of a surface layer of said first conductivity type drift layer, using said first mask, such that the first conductivity type source region is defined by said small-thickness end of said tapered end portion of the first mask;

introducing impurities so as to form a second conductivity type base region in a selected portion of the surface layer of said first conductivity type drift layer, using said first mask, such that the second conductivity type base region is defined by said large-thickness end of said tapered end portion of the first mask;

forming a third mask on a surface of said silicon carbide substrate;

introducing impurities so as to form a second conductivity type contact region that reaches said second conductivity type base region, using said third mask;

removing said first mask and said third mask;

introducing first conductivity type impurities over an entire area of the surface layer of said first conductivity type drift layer so as to control an impurity concentration of a channel region in a surface layer of said first conductivity type drift layer;

conducting heat treatment for activating the introduced impurities;

forming a gate oxide film on a surface of said silicon carbide substrate by thermal oxidation;

depositing a polysilicon layer on said gate oxide film, and patterning the polysilicon layer;

forming a fourth mask after covering said polysilicon layer and said oxide film with an insulating film;

forming a recessed portion that extends from a surface of said first conductivity type source region to said second conductivity type contact region, using said fourth mask;

forming contact holes through said insulating film, and vapor-depositing metallic films so as to form a gate electrode that contacts with said polysilicon layer, a source electrode that contacts with said first conductivity type source region and said second conductivity type contact region, and a drain electrode that contacts with said silicon carbide substrate.

19. A method for manufacturing a silicon carbide vertical PET according to claim 18, wherein a side wall is formed on a side face of said first mask, and the first mask and the side wall constitute said third mask.

20. A method for manufacturing a silicon carbide vertical FET according to claim 18, wherein, after executing the step of forming said third mask so as to form the second conductivity type contact region that reaches the second conductivity type base region, and the step of introducing impurities, using the third mask, the third mask is etched back so as to provide the first mask having the tapered end portion.

21. A method for manufacturing a silicon carbide vertical FET according to claim 18, wherein the impurities are introduced so as to form said first conductivity type source region, said second conductivity type gate region, said second conductivity type embedded region and said second conductivity type contact region, and so as to control an impurity concentration of said channel region, by implanting ions into the selected portions of the surface layer of said first conductivity type drift layer.

* * * * *